(12) United States Patent
Koyama et al.

(10) Patent No.: US 9,236,460 B2
(45) Date of Patent: Jan. 12, 2016

(54) SEMICONDUCTOR DEVICE HAVING A DIFFUSION REGION

(71) Applicant: FUJI ELECTRIC CO., LTD., Kawasaki-shi (JP)

(72) Inventors: Hiromi Koyama, Tokyo (JP); Takashi Shiigi, Matsumoto (JP); Akihiro Fukuchi, Matsumoto (JP); Seiji Momota, Matsumoto (JP); Toshiyuki Matsui, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/896,305

(22) Filed: May 16, 2013

(65) Prior Publication Data

US 2013/0307019 A1  Nov. 21, 2013

(30) Foreign Application Priority Data

May 21, 2012 (JP) ................. 2012-115494
Jan. 17, 2013 (JP) ................. 2013-006206

(51) Int. Cl.
*H01L 29/06* (2006.01)
*H01L 29/73* (2006.01)
(Continued)

(52) U.S. Cl.
CPC ........ *H01L 29/7393* (2013.01); *H01L 29/0615* (2013.01); *H01L 29/0619* (2013.01); *H01L 29/0634* (2013.01); *H01L 29/1095* (2013.01); *H01L 29/7397* (2013.01); *H01L 29/7811* (2013.01); *H01L 29/8611* (2013.01);
(Continued)

(58) Field of Classification Search
CPC ... H01L 29/417; H01L 29/90; H01L 29/0626; H01L 29/0619; H01L 29/861; H01L 21/329; H01L 29/06
USPC .................. 257/140, 291–292, 334, 494, 503; 438/193
See application file for complete search history.

(56) References Cited

U.S. PATENT DOCUMENTS 5,859,446 A     1/1999 Nagasu et al.
2003/0209774 A1*  11/2003 Jimbo et al. .................. 257/488
(Continued)

FOREIGN PATENT DOCUMENTS

FR    2 958 452 A1    10/2011
JP    H09-232597 A    9/1997
(Continued)

OTHER PUBLICATIONS

English translation of JP2011171401A.*
(Continued)

*Primary Examiner* — Amar Movva
*Assistant Examiner* — Sheikh Maruf
(74) *Attorney, Agent, or Firm* — Rabin & Berdo, P.C.

(57) ABSTRACT

A semiconductor device is disclosed. The semiconductor device is capable of obtaining a high reverse recovery resistant amount by allowing sheet resistance of a peripheral portion in a p type diffusion region that is in contact with a metal electrode through an insulating film on a surface to be as high as possible and reducing an increase in cost if possible. The semiconductor device includes: a p type diffusion region that is disposed in a surface layer of the one main surface of an n type semiconductor substrate; and a voltage-resistant region that surrounds the p type diffusion region.

14 Claims, 14 Drawing Sheets

(51) Int. Cl.
*H01L 29/739* (2006.01)
*H01L 29/78* (2006.01)
*H01L 29/861* (2006.01)
*H01L 29/10* (2006.01)
*H01L 29/40* (2006.01)

(52) U.S. Cl.
CPC ......... *H01L29/0692* (2013.01); *H01L 29/0696* (2013.01); *H01L 29/402* (2013.01); *H01L 29/404* (2013.01)

(56) References Cited

U.S. PATENT DOCUMENTS

| | | | |
|---|---|---|---|
| 2003/0222327 A1* | 12/2003 | Yamaguchi et al. | 257/500 |
| 2005/0056912 A1* | 3/2005 | Ninomiya et al. | 257/565 |
| 2005/0184336 A1* | 8/2005 | Takahashi et al. | 257/328 |
| 2006/0033153 A1* | 2/2006 | Onishi et al. | 257/328 |
| 2007/0040217 A1* | 2/2007 | Saito et al. | 257/341 |
| 2008/0135926 A1* | 6/2008 | Ono et al. | 257/328 |
| 2008/0169526 A1* | 7/2008 | Wakimoto et al. | 257/490 |
| 2009/0236697 A1* | 9/2009 | Ono et al. | 257/618 |
| 2010/0019342 A1* | 1/2010 | Kawano et al. | 257/494 |
| 2010/0140696 A1* | 6/2010 | Yedinak et al. | 257/334 |
| 2012/0032305 A1* | 2/2012 | Kitamura | 257/607 |
| 2012/0126315 A1* | 5/2012 | Onishi et al. | 257/329 |
| 2012/0299163 A1* | 11/2012 | Nishimura et al. | 257/656 |
| 2012/0299164 A1 | 11/2012 | Nishimura et al. | |

FOREIGN PATENT DOCUMENTS

| | | | |
|---|---|---|---|
| JP | 2003-152095 A | | 5/2003 |
| JP | 2010-050441 A | | 3/2010 |
| JP | 2011-171363 A | | 9/2011 |
| JP | 2011-171401 A | | 9/2011 |
| JP | 2011171401 A | * | 9/2011 |

OTHER PUBLICATIONS

F. Udrea et al., "Ultra-high voltage device termination using the 3D RESURF (Super-Junction) concept—experimental demonstration at 6.5 kV", Proceedings of the 13th International Symposium on Power Semiconductor Devices & ICS, Osaka, pp. 129-132, Jun. 4, 2001.
European Search Report issued on Sep. 17, 2013.

* cited by examiner

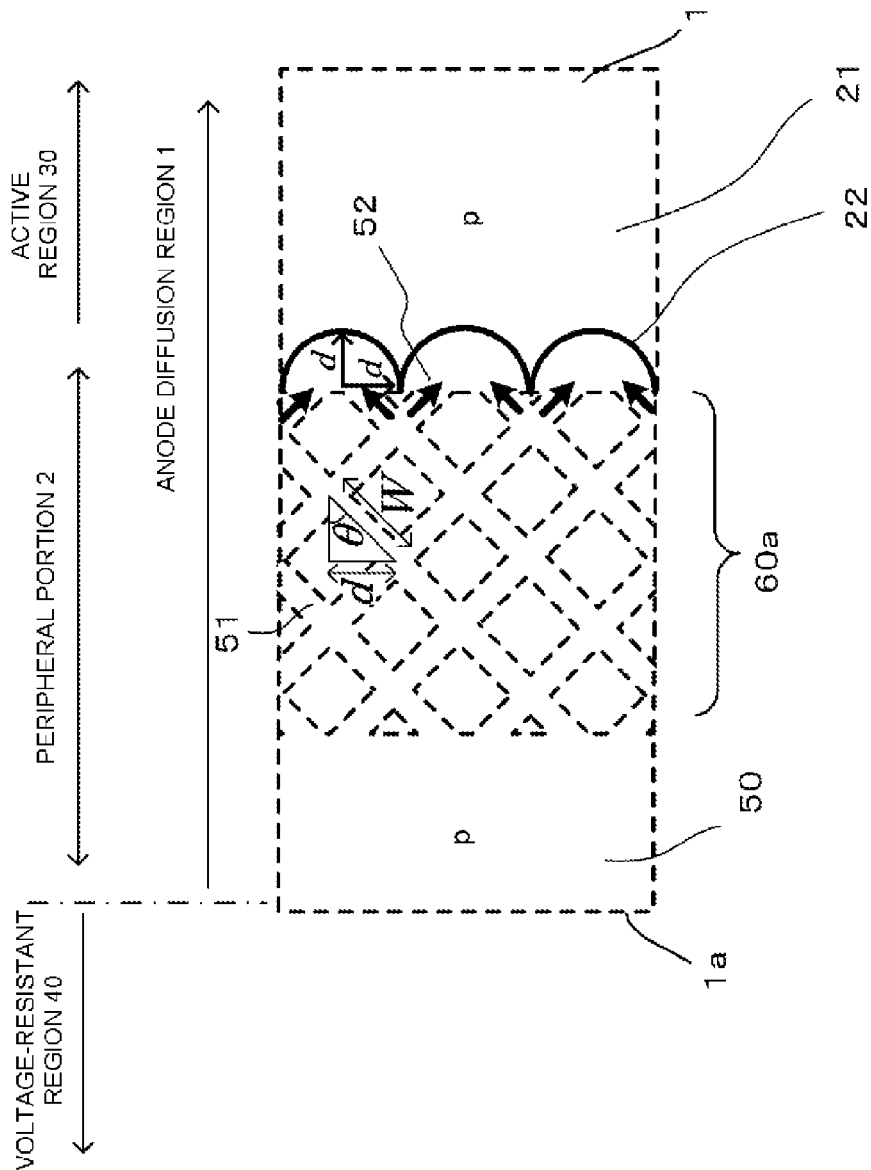

SEMICONDUCTOR DEVICE HAVING A DIFFUSION REGION

CROSS REFERENCE TO RELATED APPLICATION

The entire disclosure of the inventor's corresponding Japanese patent applications, Serial No. JP PA 2012-115494, filed May 21, 2012, and Serial No. JP PA 2013-006206, filed Jan. 17, 2013, are hereby incorporated by reference.

BACKGROUND OF THE INVENTION

1. Field of the Invention

The present invention relates to a semiconductor device such as a power device mounted on a power module or the like, and more particularly, to a semiconductor device having a junction diode structure requiring a high reverse recovery resistant.

2. Description of the Related Art

Recently, as energy saving is desired, power modules used for power converter or the like have been applied to a wide range of fields. For example, as illustrated in FIG. 9, the power module is configured to include a converter unit 100, a brake unit 200, and an inverter unit 300. The inverter unit 300 is configured so that an insulated gate bipolar transistor (IGBT) 301 and a free wheeling diode (FWD) 302 are connected to each other in reverse parallel.

In general, the FWD 302 used for the inverter unit 300 has a reverse recovery mode where a reverse blocking state is recovered from a forward conduction state. In a transient period of the reverse recovery mode, a power having a high voltage and a high current are applied to the FWD 302. If a resistant amount of the FWD with respect to the high voltage and high current, that is, a reverse recovery resistant amount is low, element breakdown easily occurs at a site where the reverse recovery current is concentrated. Therefore, in order to prevent the element breakdown, the FWD 302 uses a high reverse recovery resistant amount.

The structure of the FWD and the process of occurrence of breakdown in the reverse recovery mode will be described through the behavior of internal carriers with reference to a cross-sectional view illustrating main components of a semiconductor substrate of the FWD of the related art illustrated in FIG. 8. In a general configuration of the FWD, an n type silicon semiconductor substrate (hereinafter, abbreviated to an n type drift layer 101) is used, and a p type anode diffusion region 102 is selectively formed in the one main surface layer. An anode electrode 103 which is configured with an alloy such as Al—Si is in ohmic contact with a central surface of the p type anode diffusion region 102. An n type cathode diffusion layer 104 having a surface impurity concentration capable of allowing the layer to be in ohmic contact is formed on the rear surface of the n type drift layer 101, and a cathode electrode 105 which is configured with a laminated metal film of Ti/Ni/Au or the like is formed to be in contact with the surface of the n type cathode diffusion layer.

In addition, electric field alleviation structures such as an insulating film 109, a guard ring structure 106-1, a field plate structure 106-2, and a RESURF structure (not illustrated) are installed in a ring shape on a surface layer of the voltage-resistant region 106 surrounding the p type anode diffusion region 102 of the FWD in order to secure the resistant voltage and the resistant voltage reliability. Since main current flows in the region which is in contact with the anode electrode 103 on the central surface of the p type anode diffusion region 102 inside the voltage-resistant region 106, the region is called an active region 107. A peripheral portion 108 of the p type anode diffusion region 102 of the active region is covered with the above-described anode electrode through an insulating film such as PSG.

The load of the power module including a configuration where the FWD 302 and the IGBT 301 are arranged in reverse parallel to each other is an inductance generally representing a motor. As illustrated in FIG. 9, a return current also flows in the FWD 302 in response to ON/OFF by gate control of each IGBT 301. The initial state of the FWD 302 is a blocked state and a reverse-biased state.

When the return current flows, first, the FWD 302 having the above-described configuration is forward-biased. As illustrated in FIG. 8, in the forward-biased FWD, if the potential of holes in the p type anode diffusion region 102 exceeds the diffusion potential (internal potential) of the pn junction, the holes as minority carriers are injected from the p type anode diffusion region 102 into an n− layer (same as the n type drift layer 101). As a result, in the n type drift layer 101, the electric conductivity is changed according to the high concentration of injected hole carriers, so that the concentration of the electron carriers (majority carriers) is increased. Therefore, as seen from a well-known forward I-V curve of a diode, the forward characteristic occurs where the resistance is greatly decreased and the forward current is greatly increased.

Next, when the FWD 302 is reverse-biased, the minority carriers (holes) remaining in the n type drift layer 101 are recombined to the majority carriers (electrons) and are extracted to the anode (negative electrode) side, so that a depletion layer is spread in the n type drift layer 101. If the depletion layer is entirely spread, the FWD 302 is in the voltage blocked state. This process is called reverse recovery. The current in the above-described carrier extraction process during the reverse recovery period is called a reverse recovery current in a macro scale. In this state, the current is overflowed although the FWD 302 is reverse-biased. As a current reduction rate of the reverse recovery current is large at the time of transitioning from the forward bias to the reverse bias, the peak value of the current is increased (it is called hard recovery).

When the minority carriers (holes) are drawn out (or extracted) from the anode electrode 103 which is a negative electrode during the reverse biased period, the minority carriers are concentrated on a curvature portion 130 of the end portion of the peripheral portion 108 in the p type anode diffusion region 102. This is because equipotential lines of the electric field occurring due to the reverse bias are condensely localized in the curvature portion 130 so that the electric field density is increased, and thus, the current density and the electric field intensity are increased (particularly, when the current reduction rate is large at the time of transitioning from the forward bias to the reverse bias).

In addition, another reason why the current is concentrated on the curvature portion 130 during the reverse recovery period is that, when the main current flows in the FWD, a large amount of minority carriers exists in the lower portion of the voltage-resistant region 106 of the peripheral portion surrounding the p type anode diffusion region 102 as well as the lower portion of the p type anode diffusion region 102. The carriers of the peripheral portion are drawn into the end portion of the anode electrode 103 due to the high localized electric field during the reverse recovery period, so that the current is concentrated on the curvature portion 130.

As a method for alleviating the extraction of the minority carriers concentrated on the curvature portion 130, there is known a method having a configuration where the anode electrode 103 which is in direct contact with the surface of the p type anode diffusion region 102 is recessed in the central direction of the region by a diffusion length of the minority carriers or more. According to the configuration, the p type anode diffusion region 102 of the recessed portion is covered with the insulating film 109 to function as a resistance region (refer to ABSTRACT and FIG. 1 of JP 9-232597 A).

In addition, a document discloses that an area of a portion of an anode electrode overlapping an insulating film on a surface of a peripheral portion in a p type anode diffusion region is configured to be smaller than the insulating film area thereof, so that the reverse recovery resistant amount is improved. In addition, the document also discloses a diode where a surface width of the peripheral portion of the p type anode diffusion region is configured to be large, the insulating film is exposed without forming an anode electrode thereon or an insulating film of the exposed portion is opened, and an electrode having a floating potential is formed (refer to ABSTRACT AND FIG. 1 in JP 2010-50441 A).

FIGS. 2A and 2B are schematic diagrams illustrating a structure of a diode disclosed in JP 2010-50441 A. FIG. 2A is a plan view illustrating a portion of a plane pattern of a p type anode diffusion region; and FIG. 2B is a cross-sectional view illustrating main components of a surface portion and a surface structure of the portion corresponding to the p type anode diffusion region. An anode electrode 7 which is configured with an Al—Si alloy, an anode isolation electrode 5 (first metal film) which is configured with the same Al—Si alloy, and a field plate 6 (second metal film) are formed to have respective direct-contact portions on the surface of the p type anode diffusion region 1 through an opening portion 4 of an insulating film 3 (PSG: a phosphorus silicate glass). The anode electrode 7 and the anode isolation electrode 5 (first metal film) are electrically isolated from each other by an insulating film 3a. A p type ring-shaped region 1-1 at the outer circumferential end 1a of the p type anode diffusion region 1, which is installed in the outer-side voltage-resistant region 40, is formed in a ring-shaped plane pattern surrounding the outer circumference of the p type anode diffusion region 1 and is in contact with the field plate 6 covering the insulating film (PSG) 3 through the opening portion 4 which is installed in the insulating film (PSG) 3 covering the surface. An active region 30 where main current flows is the region where the p type anode diffusion region 1 and the anode electrode 7 are in direct conductive contact and is the central side of the insulating film 3a (right side of the figure).

In addition, there is a technique for improving an avalanche resistant amount by installing an n type non-diffusion corner region in an arch-shaped curved portion at four corners of a chip so as to be extended along the curved portion at an outer side of an anode contact region which is conductively connected to an anode electrode (refer to ABSTRACT and FIGS. 1 to 4 of JP 2011-171363 A).

Disclosed is a diode having a configuration where a convex portion which protrudes at a voltage-resistant region side, as a semiconductor substrate is seen in a plan view from a front surface side, is formed in a contact portion where an anode electrode and an anode semiconductor region are in ohmic contact with each other (refer to ABSTRACT and FIG. 1 of JP 2011-49399 A).

In addition, disclosed is a diode including a main anode region which is formed in a surface layer of an N-semiconductor layer, an isolation anode region, an anode connection region, and an anode electrode which is formed on the main anode region. The main anode region of the diode has a substantially rectangular outer circumference. The isolation anode region is formed in a ring shape along the outer circumference of the main anode region. Any one of the inner circumference of the isolation anode region and the straight line portion of the main anode region, which face each other, is configured to protrude, and the anode connection region is in point contact with the other (refer to ABSTRACT and FIGS. 1 to 4 of JP 2011-171401 A).

The diode (FWD) disclosed in JP 9-232597 A has a configuration where the insulating film 109 is installed on the surface of the peripheral portion 108 of the p type anode diffusion region 102 and the active region 107 which is in direct contact with the anode electrode 103 is recessed at the central side. In addition, the recession length of the anode electrode 103 is configured to be longer than the diffusion length of holes in the n type drift layer 101, so that the sheet resistance is increased. The current concentration at the curvature portion 130 of the peripheral portion 108 of the p type anode diffusion region 102 is suppressed by the sheet resistance.

However, as illustrated in FIG. 8, during the reverse recovery period of the diode, the occurrence of potential difference between the peripheral portion 108 of the p type anode diffusion region 102 and the p type anode diffusion region 102 at the central portion which the anode electrode 103 is in contact with may cause some problems. For example, there may be a through-hole or a thin film portion caused by some defects in the insulating film 109 in the peripheral portion of the anode electrode 103 which is in contact with the peripheral portion 108 of the p type anode diffusion region 102 through the insulating film 109. In this case, dielectric breakdown may occur, so that the p type anode diffusion region 102 and the anode electrode 103 may be short-circuited.

If the short-circuit occurs in the through-hole of the above-described insulating film 109, the amount of holes injected from the short-circuited portion is increased at the time of turn-on, the discharging of the minority carriers (holes) which are spread in the outer circumference portion (voltage-resistant region 106) within the diode is concentrated during the reverse recovery period. Therefore, the effect of alleviating the current concentration at the curvature portion 130 of the p type anode diffusion region 102 disclosed in JP 9-232597 A is not sufficient, so that the possibility of element breakdown is increased again. In many cases, the above-described defects such as the through-hole occurring in the insulating film 109 may be caused by extraneous substances, scars, or the like in a wafer process. In general, it is considered to be very difficult that the insulating film 109 having no defects is formed in the wafer process.

In addition, in the configuration of increasing the sheet resistance of the peripheral portion 108 of the p type anode diffusion region 102 disclosed in JP 9-232597 A, since the width of the peripheral portion 108 having no relation to the current capacitance of the chip is configured to be large, the chip size is increased in response to an increase in a reverse recovery resistant amount, so that the cost is increased. Therefore, a configuration capable of suppressing the reverse recovery current without increasing the width of the peripheral portion 108, if possible, is preferred.

In addition, the structure (FIG. 2) disclosed in JP 2010-50441 A is effectively used as a method of allowing no through-hole to occur on the above-described peripheral portion 108. However, since equipotential lines during the reverse recovery period are changed according to a shape of the anode isolation electrode 5, the influence on the reverse recovery resistant amount is considered.

SUMMARY OF THE INVENTION

The invention is made to solve the above described problems. The invention is to provide a semiconductor device capable of obtaining a high reverse recovery resistant amount by allowing sheet resistance of a peripheral portion in a p type diffusion region which is in contact with a metal electrode through an insulating film on a surface to be as high as possible and reducing an increase in cost if possible.

According to an aspect of the invention, there is provided a semiconductor device including: a second-conductivity-type diffusion region having a rectangular plane pattern which is arranged in a surface layer of the one main surface of a first-conductivity-type semiconductor substrate; and a ring-shaped voltage-resistant region which surrounds the second-conductivity-type diffusion region, wherein the second-conductivity-type diffusion region includes: an active region which a metal electrode is in ohmic contact with a surface of a central portion thereof; and a ring-shaped peripheral portion which surrounds the active region and includes an insulating film on a surface thereof, and wherein the peripheral portion includes a second-conductivity-type diffusion region extension portion which is selectively diffused so as to increase sheet resistance between an inner circumferential end and an outer circumferential end of the ring-shaped peripheral portion.

In the above aspect of the invention, preferably, the second-conductivity-type diffusion region extension portion of the ring-shaped peripheral portion includes: a plurality of second-conductivity-type stretch-out portions which are stretched out from the inner circumferential end toward the outer circumferential end in a stripe shape; and a ladder-shaped extension portion where a plurality of first-conductivity-type stripe-shaped substrate surfaces which are configured with exposed surfaces of the semiconductor substrate are alternately arranged in parallel to each other.

In the above aspect of the invention, more preferably, a ratio of a width of the short side of the second-conductivity-type stretch-out portion to a width of the short side of the first-conductivity-type stripe-shaped substrate surface is 0.1 or more and 0.5 or less.

In the above aspect of the invention, more preferably, when a diffusion depth of the second-conductivity-type diffusion region is defined by Xj and a width of the short side of the first-conductivity-type stripe-shaped substrate surface is defined by L, L is larger than 1.6 times Xj.

In the above aspect of the invention, preferably, the semiconductor device further includes an insulating film which covers a surface of the peripheral portion. More preferably, the semiconductor device further includes an separated electrode which is in ohmic contact with the second-conductivity-type stretch-out portion and is separated from the metal electrode.

In the above aspect of the invention, preferably, a plurality of second-conductivity-type ring-shaped diffusion regions which are electrically connected to the second-conductivity-type stretch-out portions and which have a diffusion depth larger than that of the second-conductivity-type diffusion region are arranged to be separated from each other at the outer circumference side of the ladder-shaped extension portion.

In the above aspect of the invention, more preferably, an interval between the innermost circumferential end of the plurality of the second-conductivity-type ring-shaped diffusion regions and the outer circumferential end of the second-conductivity-type diffusion region is equal to or larger than an outer-circumference-direction length of the second-conductivity-type stretch-out portion. More preferably, the second-conductivity-type stretch-out portions and innermost circumferential ends of the plurality of the second-conductivity-type ring-shaped diffusion regions are in contact with each other.

Preferably, the separated electrode which is electrically connected to the surface of the second-conductivity-type stretch-out portion is installed on a surface of the second-conductivity-type ring-shaped diffusion region which is arranged to be separated at an outer side of the ladder-shaped extension portion.

In the above aspect of the invention, preferably, a shape of the inner circumferential end in the side of the active region of the insulating film on the surface of the peripheral portion is a non-straight-line shape where an overhang length to the side of the active region is set to be large in a large-current portion and the overhang length is set to be small in a small-current portion according to an inner-circumferential-end plane distribution of the reverse recovery current having the peripheral portion as a path.

In the above aspect of the invention, preferably, the second-conductivity-type diffusion region extension portion of the ring-shaped peripheral portion includes: a plurality of first second-conductivity-type lattice line portions, each of which has an angle of θ, which is larger than 0° and smaller than 90°, with respect to a direction from a center of the semiconductor device having a rectangular shape toward an outer circumferential end of the semiconductor device; and a plurality of second second-conductivity-type lattice line portions, each of which has an angle of −θ with respect to the direction from the center toward the outer circumferential end of the semiconductor device, wherein the first second-conductivity-type lattice line portions and the second second-conductivity-type lattice line portions preferably intersect each other at an angle of 2θ.

In the above aspect of the invention, preferably, the second-conductivity-type diffusion region is an anode diffusion region, and a first-conductivity-type cathode diffusion region of which concentration is higher than that of the first-conductivity-type semiconductor substrate is installed on a surface layer of the other main surface of the first-conductivity-type semiconductor substrate, so that the semiconductor device has a function as a vertical diode.

In the above aspect of the invention, preferably, the second-conductivity-type diffusion region is a second-conductivity-type base region which is selectively formed on a surface layer of the one main surface of the first-conductivity-type semiconductor substrate, wherein a first-conductivity-type source region is selectively formed on the surface of the base region, wherein a gate electrode is formed to face surfaces of the first-conductivity-type semiconductor substrate, the base region, and the source region through a gate insulating film, and wherein a first-conductivity-type drain layer of which concentration is higher than that of the first-conductivity-type semiconductor substrate is installed on a surface layer of the other main surface of the first-conductivity-type semiconductor substrate, so that the semiconductor device has a function as a MOSFET.

In the above aspect of the invention, preferably, the second-conductivity-type diffusion region is a second-conductivity-type base region which is selectively formed on a surface layer of the one main surface of the first-conductivity-type semiconductor substrate, wherein a first-conductivity-type emitter region is selectively formed on a surface of the base region, wherein a gate electrode is formed to face surfaces of the first-conductivity-type semiconductor substrate, the base region, and the emitter region through a gate insulating film, and wherein a second-conductivity-type collector layer of which concentration is higher than that of the first-conductivity-type semiconductor substrate is installed on a surface layer of the other main surface of the first-conductivity-type semiconductor substrate, so that the semiconductor device has a function as an IGBT.

In the invention, a peripheral portion of which sheet resistance is increased by cutting out a p type diffusion region in a lattice shape is configured to be installed in an outer circumference of an anode diffusion region which is in contact with an anode electrode, and a plane shape of an inner circumferential end of an insulating film covering a surface of the peripheral portion is configured as a non-straight-line shape, so that the sheet resistance is changed according to a distribution state of reverse recovery current which is non-uniformly discharged to the anode electrode which is in contact with a surface of the anode diffusion region so as to suppress the concentration of the reverse recovery current. According to the configuration, even in the case of the peripheral portion having the same width, since the diffusion region of the path of the reverse recovery current is cut out in a lattice shape, high sheet resistance can be obtained, so that it is possible to obtain the effect of suppressing the reverse recovery current with a small increase in cost.

According to the invention, it is possible to provide a semiconductor device capable of obtaining a high reverse recovery resistant amount by allowing sheet resistance of a peripheral portion in a p type diffusion region which is in contact with a metal electrode through an insulating film on a surface to be as high as possible and reducing an increase in cost if possible.

BRIEF DESCRIPTION OF THE DRAWINGS

FIG. 14 is an enlarged plan view illustrating a vicinity of an interlayer insulating film end portion corresponding to the boundary between an active region and a peripheral portion according to the ninth embodiment of the invention illustrated in FIGS. 12A to 12C.

DETAILED DESCRIPTION OF THE PREFERRED EMBODIMENTS

Figure 1A:
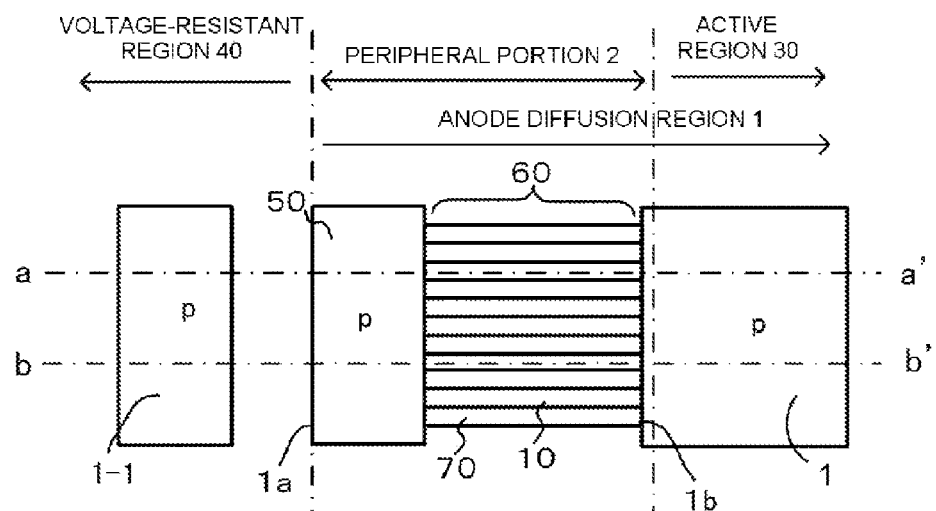
FIG. 1A is a plan view illustrating main components of a voltage-resistant region and a lattice-shaped peripheral portion of a p type anode diffusion region in a diode according to a first embodiment of the invention.

Hereinafter, embodiments of a diode as a semiconductor device according to the invention will be described in detail with reference to the drawings. In the specification and attached drawings, "n" or "p" affixed to layers or regions denotes electrons or holes as majority carriers, respectively. In addition, "+" and "−" affixed to "n" or "p" denote relatively "high" and "low" impurity concentrations, respectively. In addition, in the description of embodiments and the attached drawings, the same components are denoted by the same reference numerals, and the description thereof will not be made. Without departing from the spirit of the invention, the invention is not limited to the embodiments described hereinafter.

[First Embodiment]

Figure 1B:
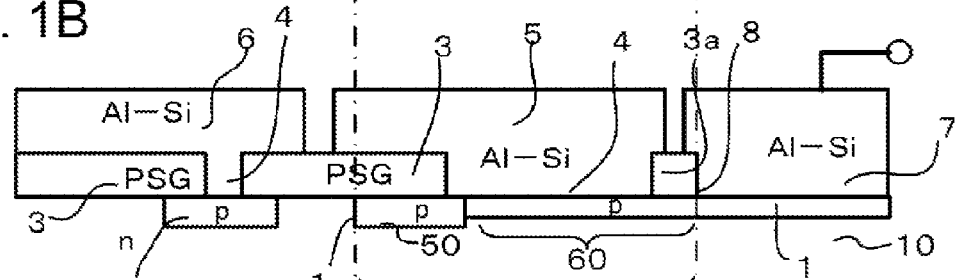
FIG. 1B is a cross-sectional view taken along line a-a' of FIG. 1A.
Figure 1C:
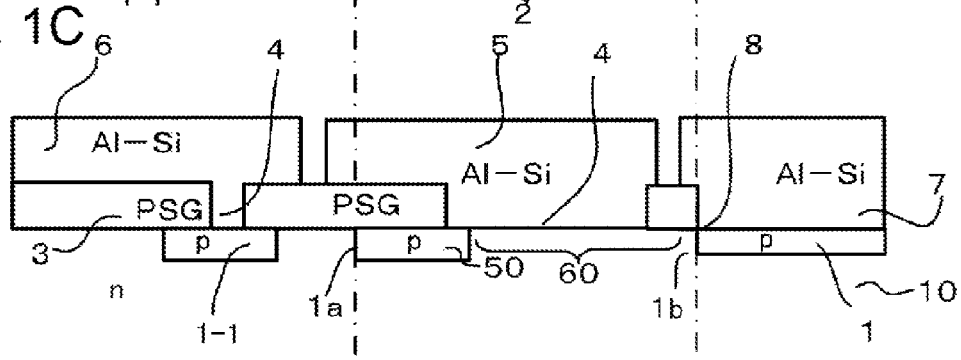
FIG. 1C is a cross-sectional view taken along line b-b' of FIG. 1A.
Figure 7:
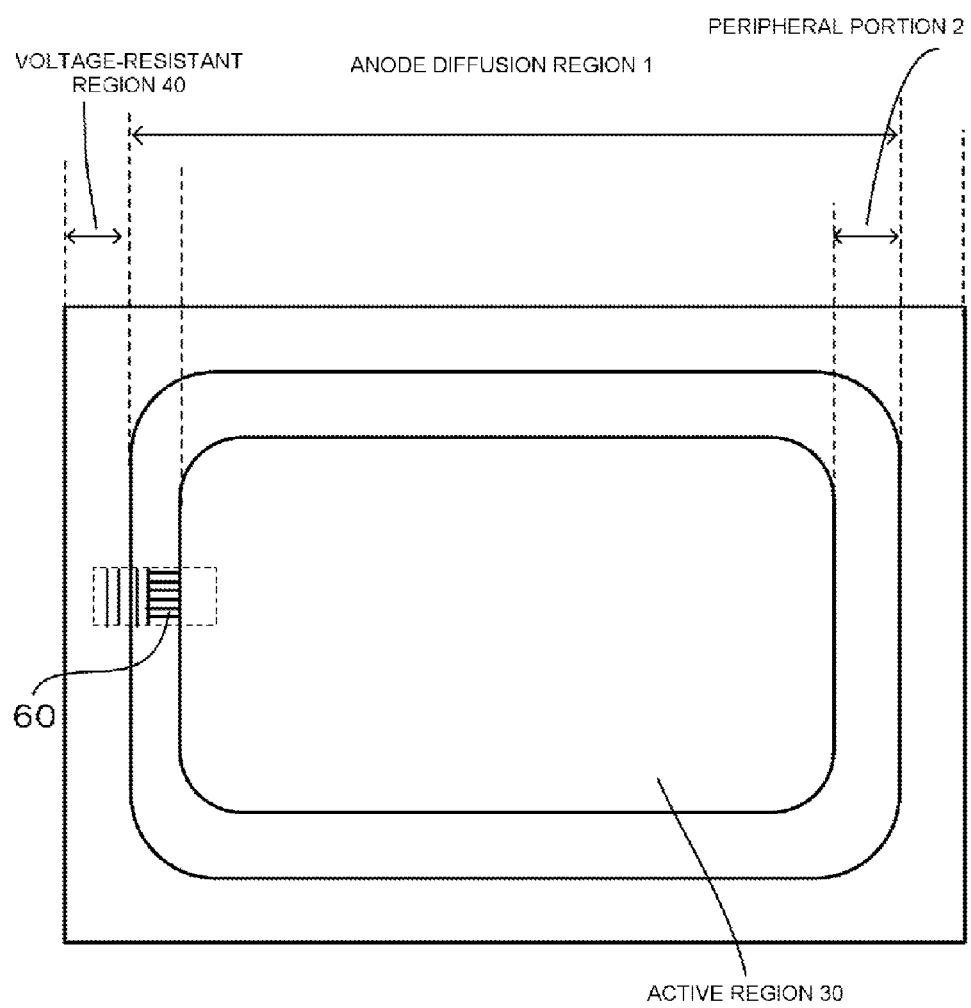
FIG. 7 is a plan view illustrating a diode chip according to the first embodiment of the invention.
Figure 8:
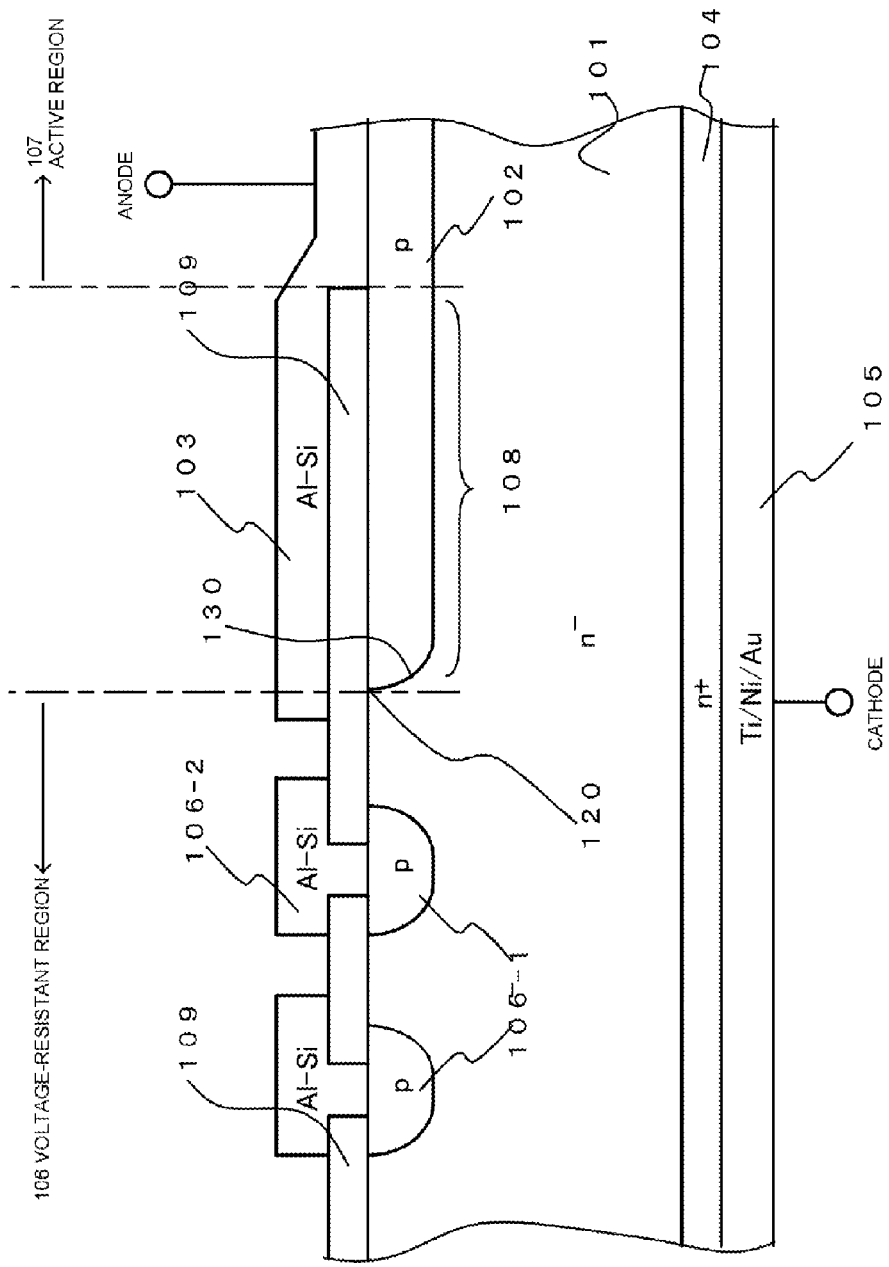
FIG. 8 is a cross-sectional view illustrating a semiconductor substrate of a diode of the related art.
Figure 9:
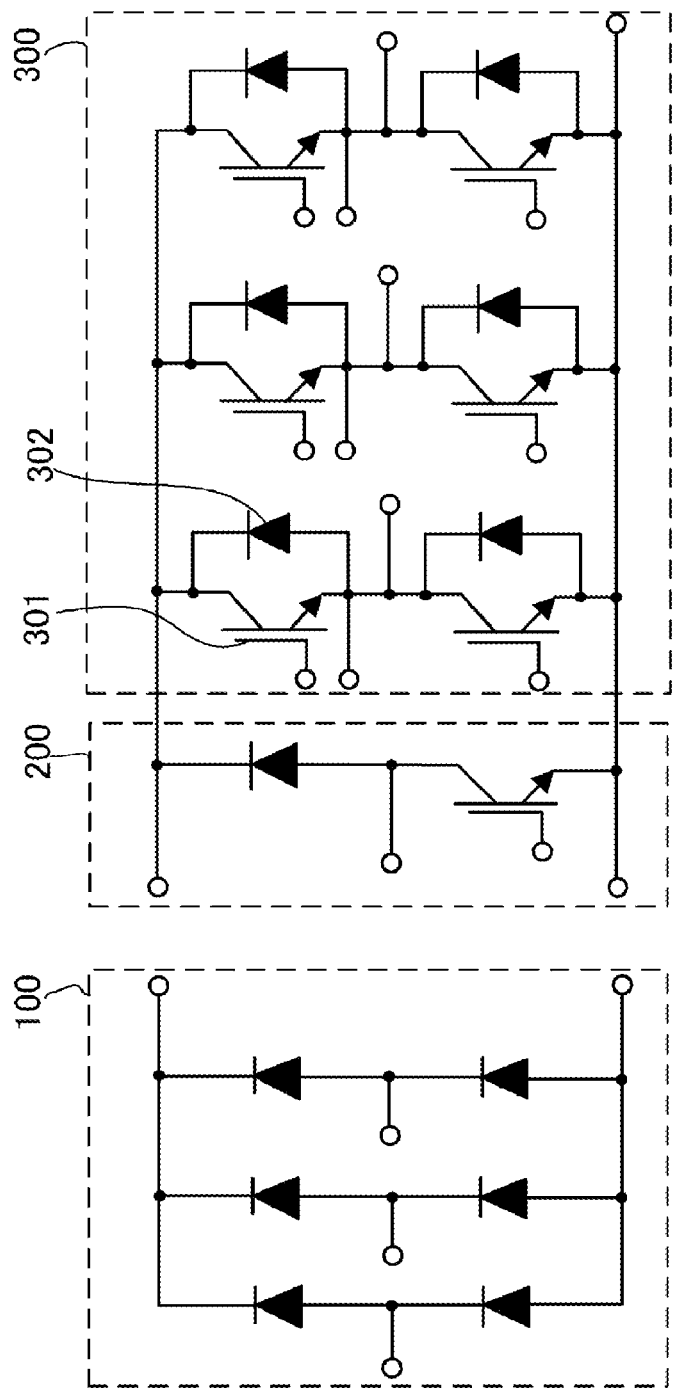
FIG. 9 is a circuit diagram illustrating a configuration of a power module.

FIG. 1A is a plan view illustrating main components of a portion of a plane pattern of a peripheral portion of a p type anode diffusion region in a vertical diode as a semiconductor device according to a first embodiment of the invention; FIG. 1B is a cross-sectional view illustrating a surface portion taken along line a-a' of FIG. 1A; and FIG. 1C is a cross-sectional view illustrating a surface portion taken along line b-b'. FIG. 7 is a plan view illustrating a diode chip according to the first embodiment.

In the plan view of main components illustrated in FIG. 1A, a peripheral portion 2 which is grown from an outer circumferential end 1b of a p type anode diffusion region 1 has a ladder shape as a plane shape. In other words, a plurality of p type anode stretch-out portions 70 are formed in parallel to each other by stretching out the p type anode diffusion region 1 in a stripe shape from the outer circumferential end 1b of the p type anode diffusion region 1 toward the outer circumference of the peripheral portion 2. In addition, n type drift layers 10 are exposed in a stripe shape between the adjacent p type anode stretch-out portions 70. The p type anode stretch-out portions 70 and the n type drift layers 10 are alternately repeated in the ring direction along the circumference of an anode electrode 7. In other words, the p type anode stretch-out portions 70 may be expressed to be formed in a ladder shape. In this manner, a ladder-shaped extension portion 60 where the p type anode stretch-out portions 70 are stretched out from the p type anode diffusion region 1 in a ladder shape is formed in the peripheral portion 2.

In FIG. 1B, the anode electrode 7 configured with an Al—Si alloy is formed on a surface of the p type anode diffusion region 1 to be in ohmic contact with the p type anode diffusion region 1. An active region 30 where main current flows is a region where the p type anode diffusion region 1 and the anode electrode 7 are in directly conductive contact with each other. The active region 30 is located at a central side (right side of the figure) of an insulating film 3a (for example, a phospho silicate glass: PSG) isolating the anode electrode 7 and a separated electrode described below. The region from an outer circumferential end 8 of the region where the anode electrode 7 and the p type anode diffusion region 1 are in contact with each other and to an outer circumferential end 1a of a p type ring-shaped diffusion region 50 (described below) which the outer circumference sides of the p type anode stretch-out portions 70 are in contact with becomes the peripheral portion 2. In addition, in the case where the p type ring-shaped diffusion region 50 is not formed, the region from the outer circumferential end 8 to the outer circumferential end of the p type anode stretch-out portions 70 becomes the peripheral portion 2.

An anode separated electrode 5 (first metal film) having a ring-shaped plane pattern which is in ohmic contact with the p type anode stretch-out portions 70 and surrounds the outer circumference of the anode electrode 7 is formed on a surface of the ladder-shaped extension portion 60 with the insulating film 3a being interposed between the anode separated electrode 5 and the anode electrode 7. The anode separated electrode 5 is separated from the anode electrode 7 through the insulating film 3a, so that the anode separated electrode 5 is electrically isolated from the anode electrode 7. In a voltage-resistant region 40 outside the outer circumferential end 1a of the peripheral portion 2, a p type ring-shaped region 1-1 is installed, and a field plate 6 (second metal film) which is in contact with the p type ring-shaped region 1-1 is formed in a ring-shaped plane pattern surrounding the outer circumference of the p type anode diffusion region 1. The p type ring-shaped region 1-1 is installed as a guard ring in the voltage-resistant region 40 outside the outer circumferential end 1a of the p type anode diffusion region 1.

In the outer circumference side of the p type anode stretch-out portions 70, the p type ring-shaped diffusion region 50 having a diffusion depth larger than that of the p type anode stretch-out portions 70 may be formed so as to be in contact with the p type anode stretch-out portions 70. The p type ring-shaped diffusion region 50 may be formed so that a total impurity amount of p type impurities thereof is larger than that of the p type anode diffusion region 1. As a result, the impurity concentration thereof is higher than that of the p type anode diffusion region 1. In addition, the p type ring-shaped diffusion region 50 is formed so that the radius of curvature of the outer circumferential end 1a thereof is larger than that of the p type anode diffusion region 1. Therefore, it is possible to obtain an effect of alleviating the electric field concentration at a depletion layer expanding when a reverse bias is applied.

Figure 2A:
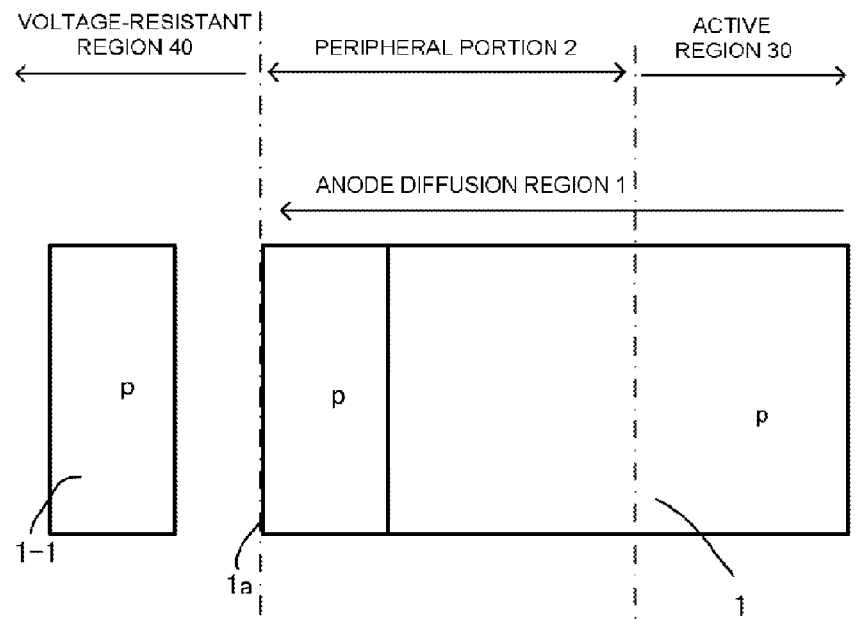
FIG. 2A is a plan view illustrating main components of a voltage-resistant region and a p type anode diffusion region in a diode of the related art.
Figure 2B:
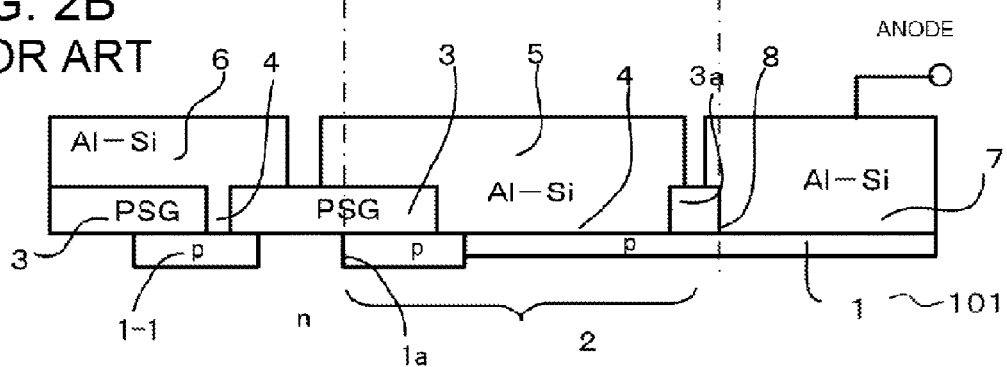
FIG. 2B is a cross-sectional view illustrating a surface portion of the voltage-resistant region and the p type anode diffusion region corresponding to FIG. 2A.

FIG. 1C is a cross-sectional view taken along line b-b' of FIG. 1A and illustrates a surface portion of a substrate where the n type drift layer 10 is exposed. In the invention, unlike a diode of the related art illustrated in FIGS. 2A and 2B where a peripheral portion is formed by increasing sheet resistance by extending a p type anode diffusion region 1 in an active region 30, the peripheral portion 2 is configured as the ladder-shaped extension portion 60 in order to increase the sheet resistance. Due to the ladder-shaped extension portion 60, it is possible to increase the sheet resistance without an increase in a width (distance between the inner circumferential end and the outer circumferential end) of the peripheral portion 2, namely, without an increase in an area of chip in comparison with a diode of the related art.

Now, the function and effect of the increase in a sheet resistance due to the ladder-shaped extension portion 60 are described. Similarly to the diode of the related art illustrated in FIGS. 2A and 2B, in the diode according to the first embodiment, during a reverse recovery period, hole current just below the peripheral portion 2 of the p type anode diffusion region 1 flows in a direction (horizontal direction when the thickness direction is defined by the vertical direction) along a main surface in the peripheral portion 2. Next, the current flows to be concentrated on the anode electrode 7 from the outer circumferential end 8 of the anode electrode 7. However, in the first embodiment, since the resistance (sheet resistance) of the horizontal direction of the peripheral portion 2 is considered to be higher due to the structure of the p type anode stretch-out portions 70, the current concentration in the vicinity of the outer circumferential end 8 is alleviated. In addition, as illustrated in the cross-sectional view of FIG. 1C according to the first embodiment, since holes are not injected in the exposed portion of the n type drift layer 10 within the p type anode stretch-out portion 70 during the reverse recovery period, remaining carriers are decreased, so that the current concentration is alleviated during the reverse recovery period.

In the ladder-shaped extension portion 60 of the peripheral portion 2, a ratio of a width (width in the ring direction) of the stripe-shaped p type anode stretch-out portion 70 to a repetition pitch of the stripe-shaped p type anode stretch-out portions 70 and the exposed portions (stripe-shaped substrate surface) of the n type drift layers 10 may be set to be 10% or more and 50% or less. In the case where the ratio is larger than 50%, the sheet resistance is decreased, so that the effect of suppressing injection of minority carriers is decreased. In the case where the ratio is smaller than 10%, the width of the stripe-shaped p type anode stretch-out portions 70 is too small, so that carriers are concentrated on the outer circumferential end 1a. At this time, the portion which the electric field is concentrated on during the reverse recovery period is a curvature portion of the outer circumferential end 1a. The electric field intensity is increased at this portion due to the concentration of current, so the reverse-recovery destruction easily occurs. Therefore, it is preferable that the ratio of the widths of the stripe-shaped p type anode stretch-out portions 70 is 10% or more and 50% or less.

In addition, since the sheet resistance of the peripheral portion 2 can be easily controlled by configuring the peripheral portion 2 to be the ladder-shaped extension portion 60, for example, the outer-circumferential-direction length of the ladder-shaped extension portion 60 (length of the stripe-shaped p type anode stretch-out portions 70) may be configured to be short. However, the outer-circumferential-direction length of the ladder-shaped extension portion 60 is secured so as not to increase the injection of holes. The p type ring-shaped diffusion region 50 located at the outer circumference side of the peripheral portion 2 is formed to have a higher concentration and a larger diffusion depth than the p type anode diffusion region 1. Therefore, as the outer-circumferential-direction length of the ladder-shaped extension portion 60 becomes smaller than the length of the p type ring-shaped diffusion region 50, the injection of minority carriers injected from the p type ring-shaped diffusion region 50 is increased. Accordingly, it is preferable that the outer-circumferential-direction length of the ladder-shaped extension portion 60 is at least equal to or larger than the length of the p type ring-shaped diffusion region 50.

A width L of the exposed portion (stripe-shaped substrate surface) of the n type drift layer 10 in the ladder-shaped extension portion 60 in the direction (namely, in the ring direction where the ladder structures are repeated) perpendicular to the outer circumferential direction may be configured as follows. First, when the stripe-shaped p type anode stretch-out portions 70 of the ladder-shaped extension portion 60 and the p type anode diffusion region 1 are simultaneously formed, a minimum stripe width and a pitch width caused from a horizontal diffusion region diffused in the surface direction according to the depth of the p type anode diffusion region 1 are considered. In other words, if the horizontal diffusion width is set to be 80% of the diffusion depth, the minimum width of the stripe-shaped p type anode stretch-out portion 70 is equal to or larger than the 160% of the diffusion depth. Therefore, the width of the exposed portion (stripe-shaped substrate surface) of the n type drift layer 10 is set so that the stripe-shaped p type anode stretch-out portions 70 of the two sides facing each other with the stripe-shaped substrate surface interposed therebetween do not overlap each other due to the horizontal diffusion. More specifically, when the diffusion depth of the p type anode diffusion region 1 is defined by Xj, it is preferable that the width L of the exposed portion (stripe-shaped substrate surface) of the n type drift layer 10 is larger than 1.6 times Xj. In addition, it is preferable that, in the substrate surface of the ladder-shaped extension portion 60, the width of the exposed portion (stripe-shaped substrate surface) of the n type drift layer 10 inserted into the ladder-shaped extension portion 60 is equal to or larger than the diffusion length of the hole carriers.

As described above, in the case of using the ladder-shaped extension portion 60, the p type anode diffusion region 1 may be extended in the outer circumferential direction, or the ladder-shaped extension portion 60 may be formed so as to be connected to the p type anode diffusion region 1 by using the p type ring-shaped diffusion region 50. The sheet resistance of the p type anode diffusion region 1 is, for example, about 1000Ω/, and the sheet resistance of the p type ring-shaped diffusion region 50 is, for example, 50Ω/.

In the case of using the p type ring-shaped diffusion region 50, the sheet resistance of the ladder-shaped extension portion 60 is typically 100Ω/. Preferably, the sheet resistance of the ladder-shaped extension portion 60 is 50Ω/ or more and 300Ω/ or less.

When the ratio of the widths of the p type anode stretch-out portions 70 in the ladder-shaped extension portion 60 is larger than 50%, the sheet resistance becomes substantially 50Ω/ or less. In this case, holes can be easily injected from the anode electrode into the ladder-shaped extension portion 60, so that the carrier density under the peripheral portion 2 and the voltage-resistant region 40 is increased. Therefore, the current concentration easily occurs at the end portion of the anode electrode during the reverse recovery period, so that the effect of increasing the reverse recovery resistant amount is decreased. Accordingly, it is preferable that the sheet resistance of the ladder-shaped extension portion 60 is 50Ω/ or more.

On the other hand, the ratio of the widths of the p type anode stretch-out portions 70 is smaller than 10%, the sheet resistance is substantially 300Ω/ or more. In this case, the voltage drop of the holes passing through the ladder-shaped extension portion 60 during the reverse recovery period is increased (for example, 100 V or more). Therefore, most of the hole current flows in the anode separated electrode. At this time, the current is concentrated on the end portion where the anode separated electrode and the ladder-shaped extension portion 60 are in contact with each other, so that the reverse recovery resistant amount is decreased. For the reasons described hereinbefore, it is preferable that the sheet resistance of the ladder-shaped extension portion 60 is 300Ω/ or less.

[Second Embodiment]

Figure 3A:
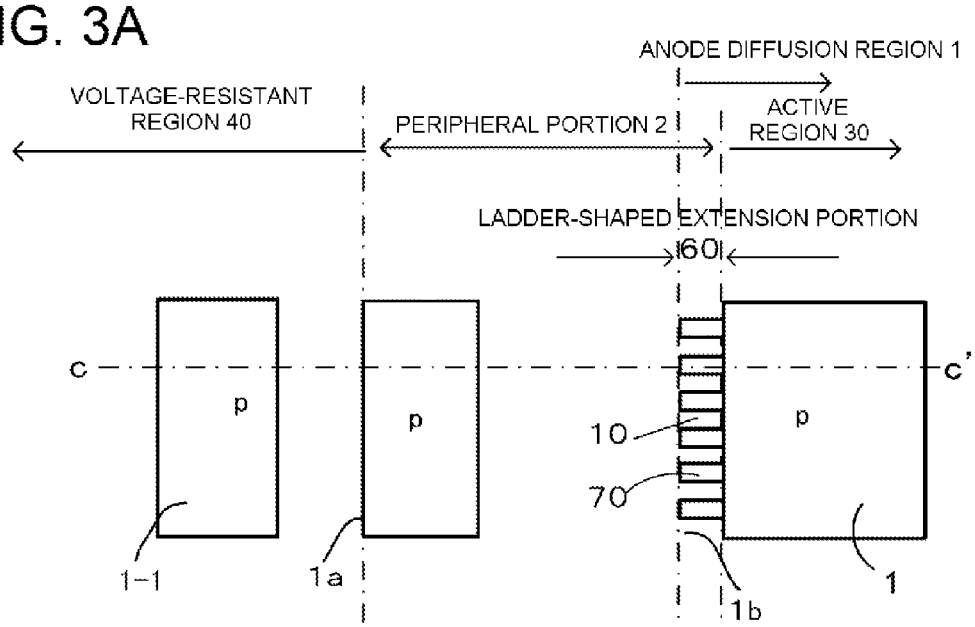
FIG. 3A is a plan view illustrating main components of a voltage-resistant structure region and a p type anode diffusion region in a diode according to a second embodiment of the invention.
Figure 3B:
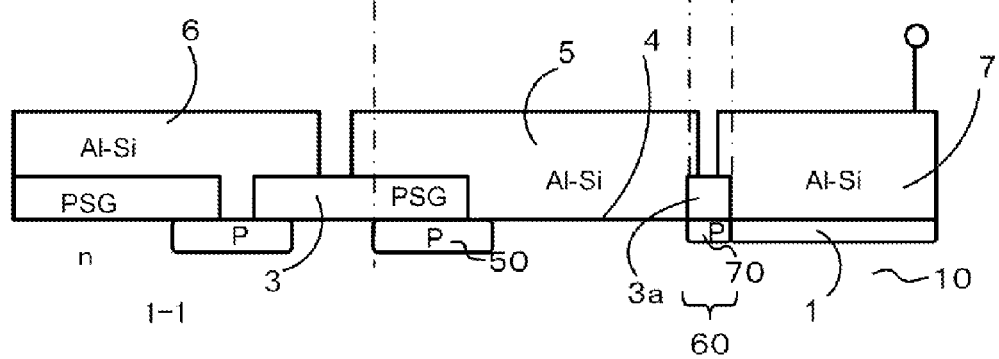
FIG. 3B is a cross-sectional view taken along line c-c' of FIG. 3A.

FIG. 3 is a cross-sectional view illustrating a surface portion of a diode as a semiconductor device according to a second embodiment of the invention. In the embodiment, the peripheral portion 2 of the p type anode diffusion region 1 includes a ladder-shaped extension portion 60 having a short extension width which is substantially equal to the width of the insulating film 3a for insulating the anode electrode 7 and the anode separated electrode 5 (first metal film). In other words, the ladder-shaped extension portion 60 is separated from the p type ring-shaped diffusion region 50 which is connected to the anode separated electrode 5. However, in terms of an electric circuit, the ladder-shaped extension portion 60 and the p type ring-shaped diffusion region 50 are connected to each other through the anode separated electrode 5. In the diode according to the second embodiment, an increase in area of the ladder-shaped extension portion 60 is suppressed, so that it is possible to increase the sheet resistance. The short extension length of the ladder-shaped extension portion 60 which is substantially equal to the width of the insulating film 3a may be equal or larger than the diffusion length of holes. As a result, it is possible to suppress the current density of the current flowing in the ladder-shaped extension portion 60 during the reverse recovery period. In addition, in the exposed portion of the n type drift layer 10 in the peripheral portion 2, since holes are not injected during the reverse recovery period, remaining carriers are decreased, so that the current concentration is alleviated during the reverse recovery period. In addition, in the substrate surface of the ladder-shaped extension portion 60, the width of the exposed portion (stripe-shaped substrate surface) of the n type drift layer 10 interposed between the stripe-shaped p type anode stretch-out portions 70 may be equal to that of the first embodiment.

[Third Embodiment]

Figure 4A:
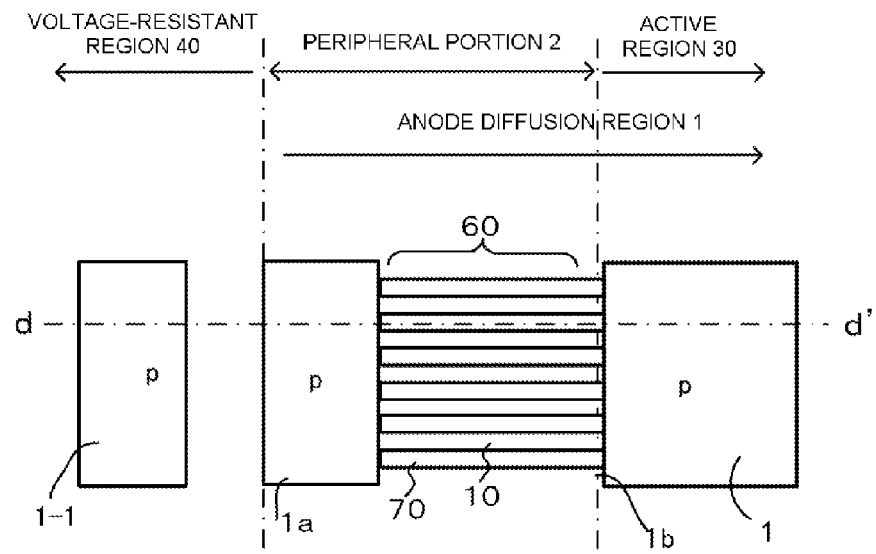
FIG. 4A is a plan view illustrating main components of a voltage-resistant structure region and a p type anode diffusion region in a diode according to a third embodiment of the invention.
Figure 4B:
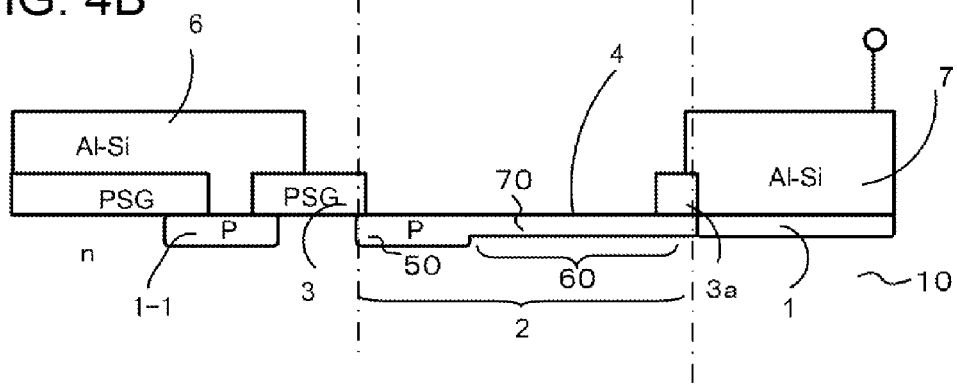
FIG. 4B is a cross-sectional view taken along line d-d' of FIG. 4A.

FIG. 4A is a plan view illustrating a portion of a diode as a semiconductor device according to a third embodiment of the invention; and FIG. 4B is a cross-sectional view taken along line d-d' of FIG. 4A. In the configuration of the embodiment, the peripheral portion 2 includes the p type ring-shaped diffusion region 50, the stripe-shaped p type anode stretch-out portions 70, and an opening portion 4 which is formed in the insulating film 3, and there is no surface metal film (first metal film 5) which is in ohmic contact illustrated in FIGS. 1A to 1C. According to the configuration, similarly to the first embodiment, in the ladder-shaped extension portion 60, an increase in area of the p type anode diffusion region 1 is suppressed, so that it is possible to increase the sheet resistance. As a result, it is possible to suppress the current density of the current flowing in the ladder-shaped extension portion 60 during the reverse recovery period. In addition, in the exposed portion of the n type drift layer 10 in the ladder-shaped extension portion 60, since holes are not injected during the reverse recovery period, remaining carriers are decreased, so that the current concentration is alleviated during the reverse recovery period. In addition, the width of the exposed portion (stripe-shaped substrate surface) of the n type drift layer 10 in the ladder-shaped extension portion 60 may be set to be the same length as that of the first embodiment. In addition, although not illustrated, in all the embodiments of the invention, in general, a passivation film (protective film) such as a polyimide film or a silicon nitride film is formed on a surface ranging from the voltage-resistant region 40 to a portion of the outer circumference side of the active region 30. In the embodiment, the surface of the wide opening portion 4 of the peripheral portion 2 is covered with a passivation film.

[Fourth Embodiment]

Figure 5A:
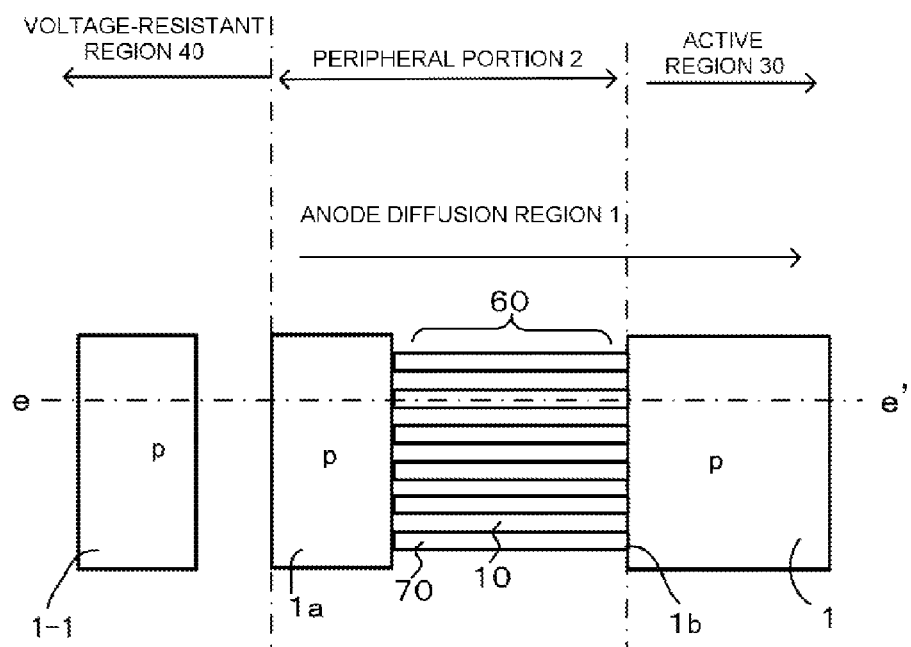
FIG. 5A is a plan view illustrating main components of a voltage-resistant structure region and a p type anode diffusion region in a diode according to a fourth embodiment of the invention.
Figure 5B:
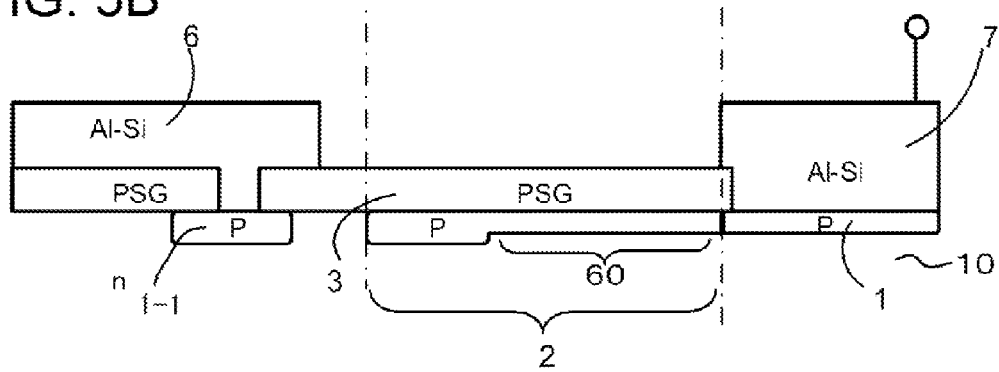
FIG. 5B is a cross-sectional view taken along line e-e' of FIG. 5A.

FIG. 5 is a cross-sectional view illustrating a surface portion of a diode as a semiconductor device according to a fourth embodiment of the invention. In the configuration of the embodiment, the surfaces of the ladder-shaped extension portion 60 and the p type ring-shaped diffusion region 50 of the peripheral portion 2 are covered with an insulating film 3a, and there is no surface metal film (first metal film 5). According to the configuration, similarly to the first embodiment, in the ladder-shaped extension portion 60, an increase in area of the p type anode diffusion region is suppressed, so that it is possible to increase the sheet resistance. As a result, it is possible to suppress the current density of the current flowing in the ladder-shaped extension portion 60 during the reverse recovery period. In addition, in the exposed portion (stripe-shaped substrate surface) of the n type drift layer 10 in the ladder-shaped extension portion 60 in the peripheral portion 2, since holes are not injected during the reverse recovery period, remaining carriers are decreased, so that the current concentration is alleviated during the reverse recovery period. In addition, the width of the exposed portion (stripe-shaped substrate surface) of the n type drift layer 10 may be set to be the same length as that of the first embodiment.

[Fifth Embodiment]

Figure 6A:
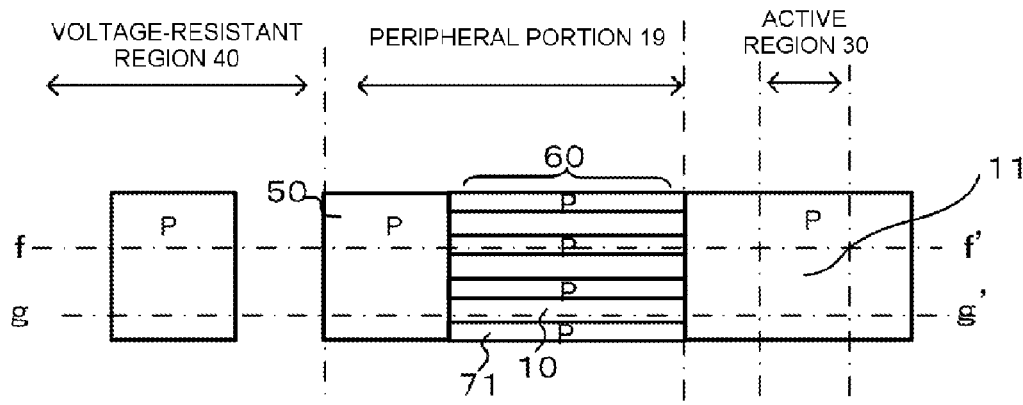
FIG. 6A is a plan view illustrating main components of a voltage-resistant region and a ladder-shaped peripheral portion of a p type anode diffusion region in an IGBT according to a fifth embodiment of the invention.
Figure 6B:
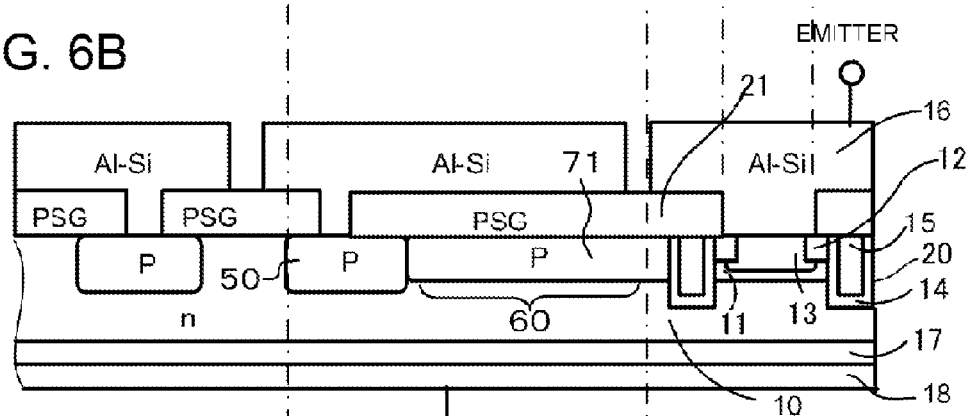
FIG. 6B is a cross-sectional view taken along line f-f' of FIG. 6A.
Figure 6C:
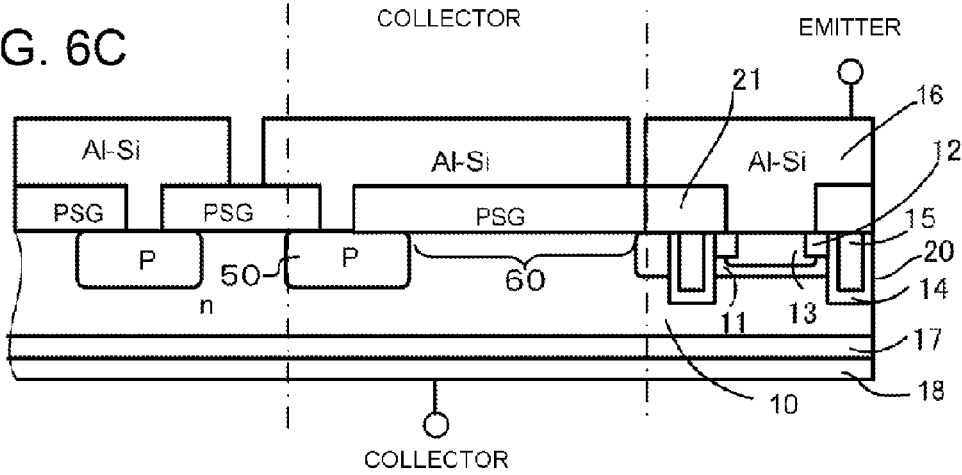
FIG. 6C is a cross-sectional view taken along line g-g' of FIG. 6A.

FIG. 6A is a plan view illustrating main components in a portion of a plane pattern of a peripheral portion in a p type base region of a vertical IGBT as a semiconductor device according to a fifth embodiment of the invention; FIG. 6B is a cross-sectional view illustrating a surface portion taken along line f-f' of FIG. 6A; and FIG. 6C is a cross-sectional view illustrating a surface portion taken along line g-g' of FIG. 6A. In the cross-sectional view illustrating the surface portion of the IGBT, a p type base region 11 is installed at a first main surface side (front surface side) of an n− type semiconductor substrate (n type drift layer 10). An n type emitter region 12 and a p+ contact region 13 which is adjacent to the n type emitter region 12 at the surface thereof are included in a surface layer of the p type base region 11. Furthermore, an active region 30 where a plurality of trenches 20 are arranged to be parallel to each other in a stripe-shaped plane pattern and the p type base region 11 are arranged on the first main surface between the parallel-arranged trenches 20 is included in the first main surface. A gate electrode 15 which is configured with a conductive polysilicon is installed within the trench 20 through a gate oxide film 14. An emitter electrode 16 is configured to be conductively connected to the surface of the n type emitter region 12 and the surface of the p+ contact region 13 to cover the gate electrode through an interlayer insulating film 21. Furthermore, a p type collector layer 17 is installed at a second surface side (rear surface side), and a collector electrode 18 is installed to be in contact with the p type collector layer 17.

One of the features of the invention is that, as seen in a plan view, the peripheral portion 19 of the p type base region 11 includes a ladder-shaped extension portion 60 which is configured in a ladder shape. In other words, similarly to the first embodiment or the like, a plurality of p type base stretch-out portions 71 are formed by stretching out the p type base region 11 in a stripe shape from the outer circumferential end of the p type base region 11 to the outer circumferential end of peripheral portion 19. In addition, n type drift layers 10 are exposed in a stripe shape between the adjacent p type base stretch-out portions 71, so that a stripe-shaped substrate surface is formed. The p type base stretch-out portions 71 and the stripe-shaped n type drift layers 10 are alternately repeated in the ring direction along the circumference of the emitter electrode 16. In other words, the p type base stretch-out portions 71 may be expressed to be formed in a ladder shape. In this manner, the ladder-shaped extension portion 60 where the p type base stretch-out portions 71 are stretched out from the p type base region 11 in a ladder shape is formed in the peripheral portion 19. Due to the functions described above in the first to fourth embodiments, the ladder-shaped extension portion 60 becomes a region having high sheet resistance, so that the current concentration in the vicinity of the outer circumferential end of the p type base region 11 is alleviated during the turn-off period.

[Sixth Embodiment]

An n-channel type MOSFET (not illustrated) is obtained by replacing the p type collector layer 17 of the semiconductor device according to the fifth embodiment of the invention with an n type drain layer of which concentration is higher than that of the n type drift layer 10. A parasitic diode (sometimes, referred to as an embedded diode) including a p type base region 11, an n type drift layer 10, and an n type drain layer exists in the MOSFET. In the case where the parasitic diode performs a reverse recovery operation, the ladder-shaped extension portion 60 becomes a region having high sheet resistance due to the functions of the first to fourth embodiments, so that the current concentration in the vicinity of the outer circumferential end of the p type base region 11 is alleviated during the reverse recovery period.

[Seventh Embodiment]

Figure 10A:
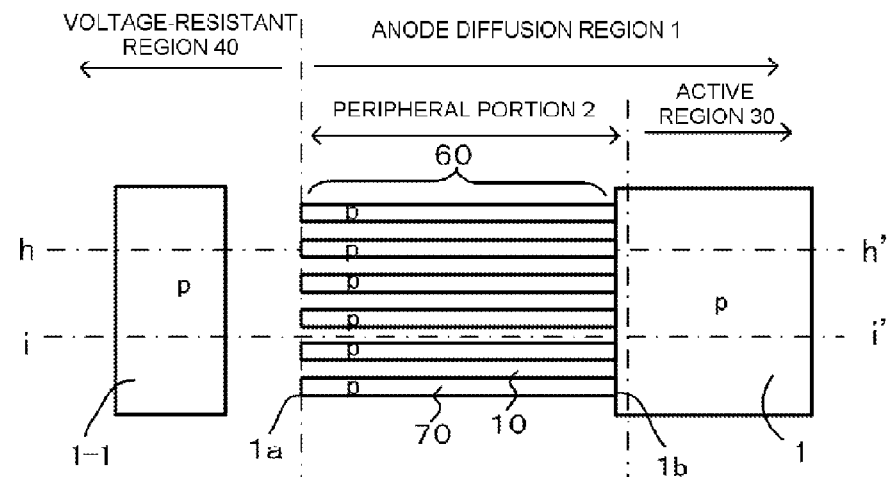
FIG. 10A is a plan view illustrating main components of a voltage-resistant region and a lattice-shaped peripheral portion of a p type anode diffusion region in a diode according to a seventh embodiment of the invention.
Figure 10B:
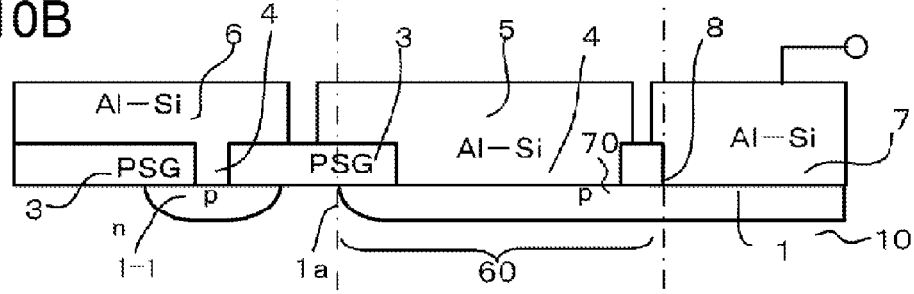
FIG. 10B is a cross-sectional view taken along line h-h' of FIG. 10A.
Figure 10C:
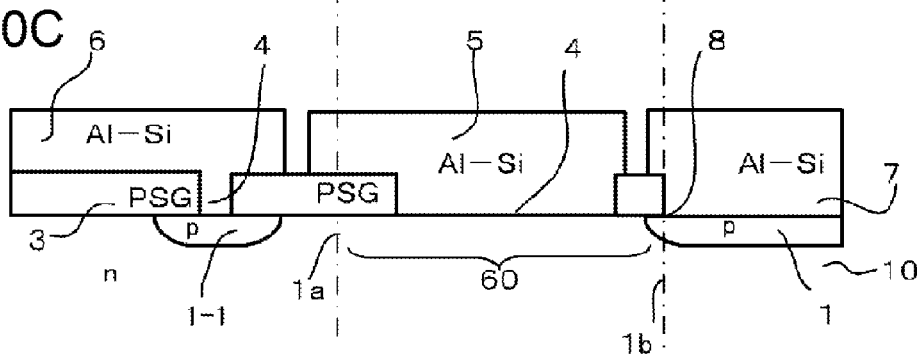
FIG. 10C is a cross-sectional view taken along line i-i' of FIG. 10A.

FIG. 10 illustrates a diode as a semiconductor device according to a seventh embodiment of the invention. The seventh embodiment is different from the first embodiment in that the p type ring-shaped diffusion region 50 of the first embodiment is removed. For example, in the case where the p type anode diffusion region 1 has a large diffusion depth of 5 µm or more and 30 µm or less, since the radius of curvature of the end portion of the p type anode diffusion region 1 is sufficiently large, although the p type ring-shaped diffusion region 50 is not formed, the electric field intensity at the end portion of the p type anode diffusion region 1 can be sufficiently alleviated. Therefore, the ladder-shaped extension portion 60 becomes a region having high sheet resistance due to the same function as that of the diode of the first embodiment, so that the current concentration in the vicinity of the outer circumferential end of the p type base region 11 is alleviated during the reverse recovery.

[Eighth Embodiment]

Figure 11A:
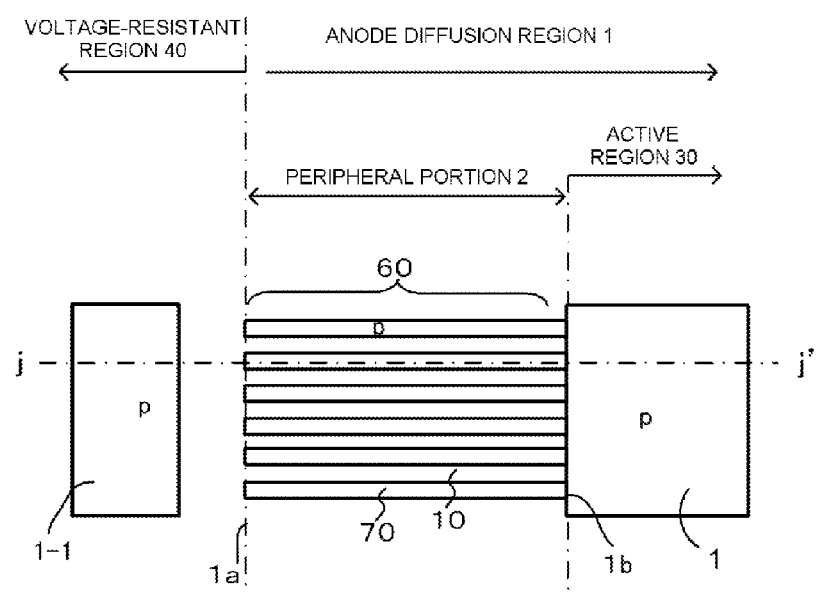
FIG. 11A is a plan view illustrating main components of a voltage-resistant region and a lattice-shaped peripheral portion of a p type anode diffusion region in a diode according to an eighth embodiment of the invention.
Figure 11B:
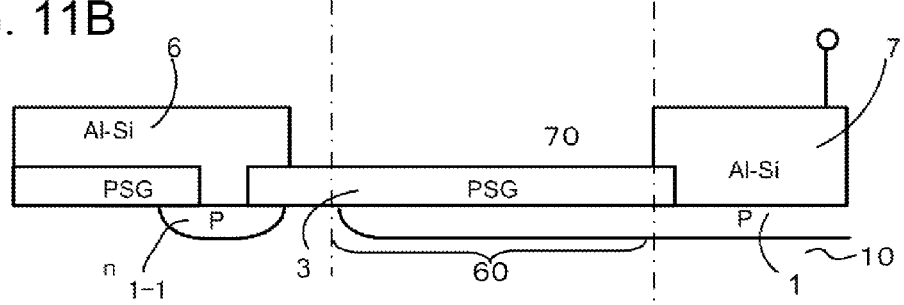
FIG. 11B is a cross-sectional view taken along line j-j' of FIG. 11A.

FIG. 11 is a cross-sectional view illustrating a surface portion of a diode as a semiconductor device according to an eighth embodiment of the invention. The eighth embodiment is different from the fourth embodiment in that the p type ring-shaped diffusion region 50 of the fourth embodiment is removed. For example, in the case where the p type anode diffusion region 1 has a large diffusion depth of 5 µm or more and 30 µm or less, since the radius of curvature of the end portion of the p type anode diffusion region 1 is sufficiently large, although the p type ring-shaped diffusion region 50 is not formed, the electric field intensity at the end portion of the p type anode diffusion region 1 can be sufficiently alleviated. Therefore, the ladder-shaped extension portion 60 becomes a region having high sheet resistance due to the same function as that of the diode of the first embodiment, so that the current concentration in the vicinity of the outer circumferential end of the p type base region 11 is alleviated during the reverse recovery period.

[Ninth Embodiment]

Figure 12A:
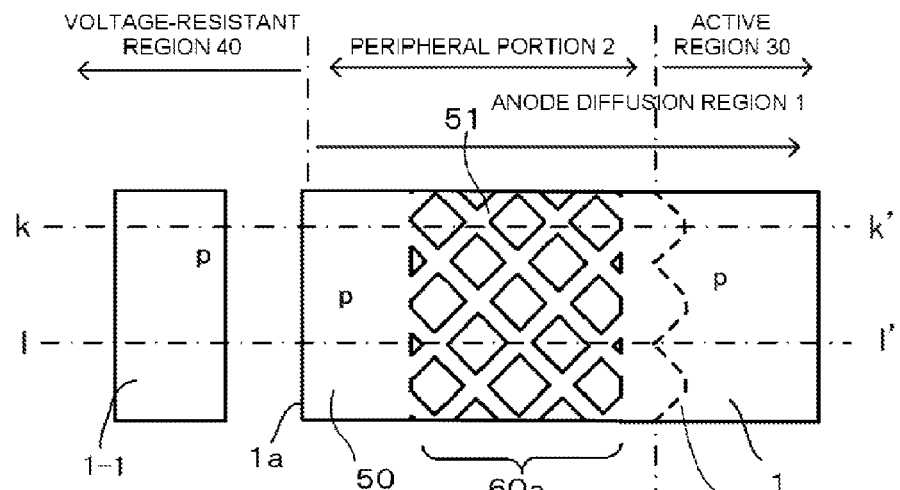
FIG. 12A is a plan view illustrating main components of a voltage-resistant region and a lattice-shaped peripheral portion of a p type anode diffusion region in a diode according to a ninth embodiment of the invention.
Figure 12B:
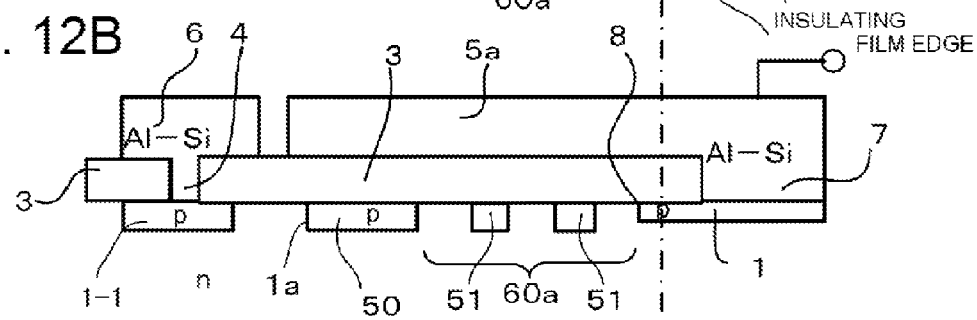
FIG. 12B is a cross-sectional view taken along line k-k' of FIG. 12A.
Figure 12C:
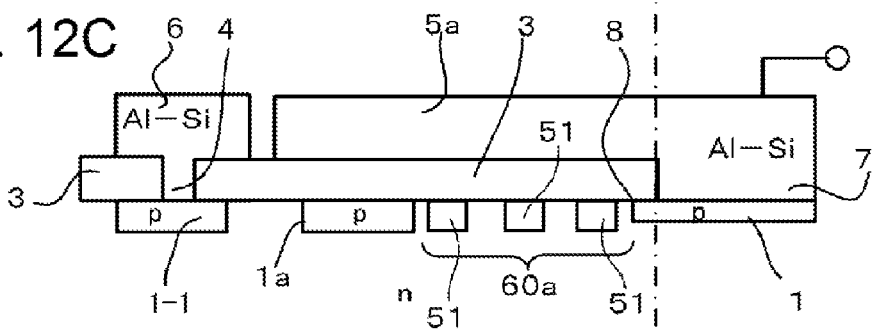
FIG. 12C is a cross-sectional view taken along line l-l' of FIG. 12A.
Figure 13:
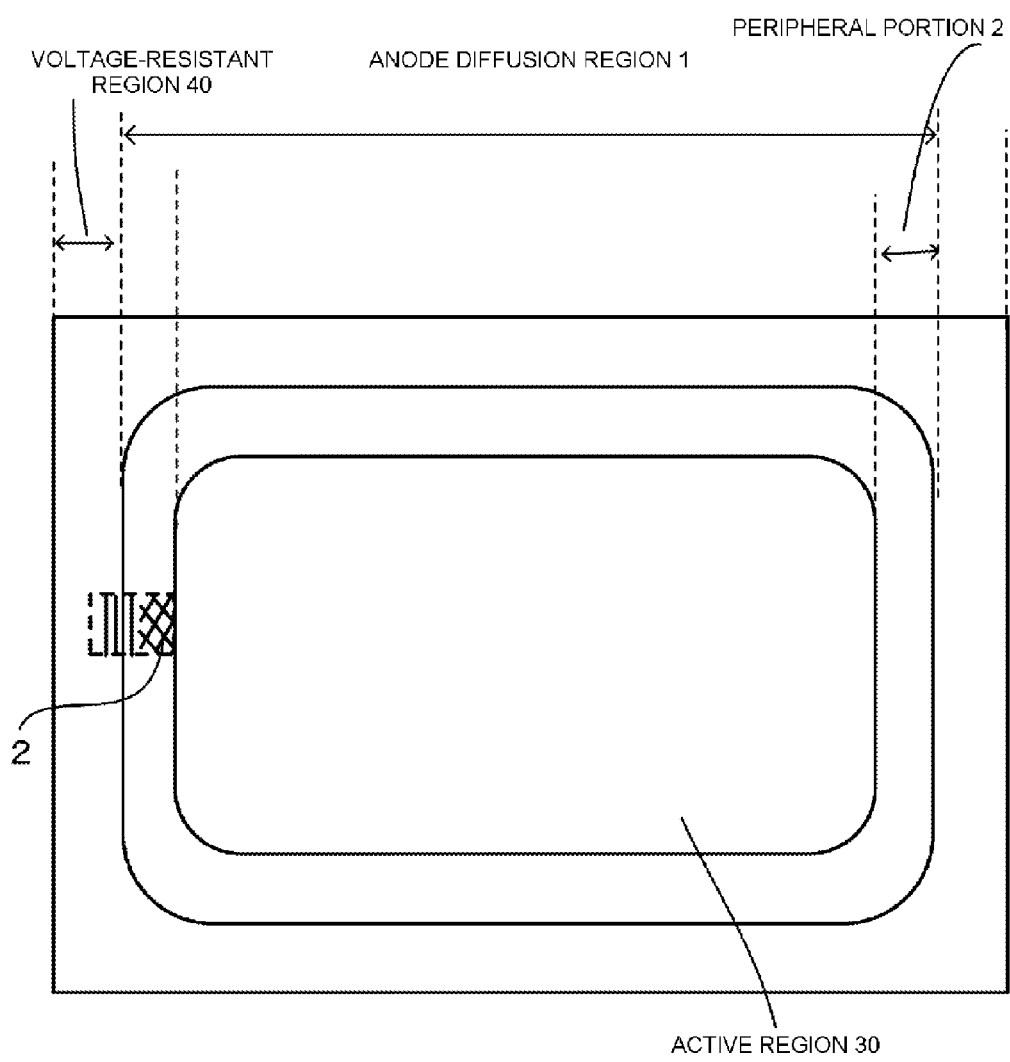
FIG. 13 is a plan view illustrating a diode chip according to the ninth embodiment of the invention.

FIG. 12 is a cross-sectional view illustrating a surface portion of a diode as a semiconductor device according to a ninth embodiment of the invention. FIG. 13 is a plan view illustrating overall portions of the diode as the semiconductor device according to the ninth embodiment of the invention including FIG. 12. FIG. 12A is an enlarged plan view illustrating a portion indicated by a broken line area in FIG. 13; FIG. 12B is a cross-sectional view taken along line k-k' of FIG. 12A; and FIG. 12C is a cross-sectional view taken along line l-l' of FIG. 12A.

A peripheral portion 2 includes a lattice-shaped stretch-out portion 60a which is patterned in a lattice shape instead of the ladder-shaped extension portion 60 of the first embodiment. In the configuration of the embodiment, all the surfaces of the lattice-shaped stretch-out portion 60a and the p type ring-shaped diffusion region 50 are covered with an insulating film 3a, and the insulating film 3 is covered with an anode electrode extension portion 5a of an anode electrode 7 extended to the peripheral portion 2. The configuration where the anode electrode extension portion 5a overrides the p type ring-shaped diffusion region 50 and is extracted to the side of the voltage-resistant region 40 is also preferable because the effect of alleviating the electric field at the surface of the outer circumferential end 1a can be obtained due to the configuration. In this manner, the lattice-shaped stretch-out portion 60a is different from the ladder-shaped extension portions 60 according to the first to eighth embodiments in terms of a plane pattern. In addition, the ninth embodiment is different from the first to eight embodiments in that the edge shape (plane shape of the end portion) of the side of the active region 30 of the insulating film 3 covering the upper portion of the peripheral portion 2 is a curve shape instead of a straight line shape. The two different points will be described below. In the ninth embodiment, similarly to the first to eighth embodiments, in the lattice-shaped stretch-out portion 60a, an increase in area of the p type anode diffusion region is suppressed, so that it is possible to increase the sheet resistance.

The pattern of the lattice-shaped stretch-out portion 60a, which becomes a path of current during the reverse recovery period, has an inclined lattice shape instead of a ladder shape of the ladder-shaped extension portion 60. In this manner, since the p type lattice line portion 51 is formed to be inclined instead of being perpendicular to the direction toward the outer circumference, the distance in the direction toward the outer circumference can be increased in comparison with the above-described stripe shaped pattern. Therefore, it is possible to easily increase the sheet resistance. Accordingly, the effect of suppressing current concentration during the reverse recovery is improved.

As an example, specifications of the ninth embodiment are described. The rated voltage is in a range of 600 V to 6500 V, for example, 1200 V. The resistivity of a semiconductor substrate (for example, silicon) constituting the n– drift layer corresponding to the rated voltage is in a range of 20 Ωcm to 500 Ωcm, for example, 50 Ωcm. The thickness of the substrate is in a range of 60 μm to 500 μm, for example, 120 μm. The surface concentration of the p type anode diffusion region is in a range of $1 \times 10^{16}/cm^3$ to $1 \times 10^{18}/cm^3$, for example, $3 \times 10^{16}/cm^3$. The diffusion depth of the layer is in a range of 1 μm to 5 μm, for example, 3 μm. The width of the peripheral portion 2 is 100 μm or more and 1000 μm or less, for example, 300 μm. In addition, the same specifications described hereinbefore are applied to the first to eighth embodiments as well as the ninth embodiment.

It is preferable that the width of the p type lattice line portions 51 constituting the lattice pattern of the lattice-shaped stretch-out portion 60a is, for example, 3 μm or more 100 μm or less.

In the formation of the p type lattice line portion 51, p type impurity (boron or the like) ions are injected. If the width of opening of a mask used for the ion injection is set to 1 μm, the width of the p type lattice line portion 51 becomes 3 μm including the horizontal diffusion portion (about 80% of the vertical directional portion) when the diffusion depth is 2 μm. If the width of the p type lattice line portion 51 is set to 3 μm, the sheet resistance of the lattice-shaped stretch-out portion 60a can be configured to be 300 Ω/□ or less.

On the other hand, the length of the resistant voltage structure region is typical in a range of 100 μm (for example, in the case of the rated voltage of 600 V) to 700 μm (for example, in the case of the rated voltage of 3.3 kV). Therefore, in the case of the rated voltage of about 600 V, the region having the width of the p type lattice line portion 51 becomes the resistant voltage structure region. In the case where the width of the p type lattice line portion 51 is set to 100 μm, the lattice-shaped pattern is formed by using the p type lattice line portions 51, and the length of the lattice-shaped stretch-out portion 60a is larger than 100 μm. Therefore, it is preferable that the width of the p type lattice line portion 51 is 100 μm or less.

It is preferable that the repetition pitch W of the p type lattice line portions 51 adjacent to each other in parallel among the p type lattice line portions 51 in the lattice-shaped pattern is 4 μm or more and 200 μm or less. As described above, since the width of the p type lattice line portion 51 is 3 μm or more, it is preferable that the pitch is 4 μm or more. Since the ratio of the width of the p type lattice line portion 51 to the pitch W is preferably 50% or less as described above, it is preferable that the pitch W is 6 μm or more. On the other hand, in the case where the width of the p type lattice line portion 51 is set to 100 μm as described above, it is preferable that the pitch W is 500 μm or less.

FIG. 14 is an enlarged plan view illustrating a vicinity of an interlayer insulating film end portion 22 corresponding to the boundary between the active region 30 and the peripheral portion 2 according to the ninth embodiment illustrated in FIGS. 12A to 12C. The interlayer insulating film end portion 22 is configured to be separated by the longest distance d from the site where the maximum amount of the hole current 52 is collected during the reverse recovery period. Therefore, the position of the highest hole current density can be configured to separated by a long distance from the interlayer insulating film end portion 22. As illustrated in FIG. 14, it is preferable that the relation between the distance d and the above-described pitch W is d≥W sin θ if the angle between the p type lattice line portion 51 and the direction perpendicular to the outer circumferential direction of the chip is defined by θ.

In this manner, the edge (end portion) shape of the insulating film 3 covering the lattice-shaped extension portion 60a at the side of the active region 30 is configured in accordance with the flow distribution of the reverse recovery current caused by the inclined lattice-shaped pattern. In other words, in the end portion of the insulating film 3, the overhang length of the insulating film 3 at the site where the hole current is collected during the reverse recovery period is configured to be large, and the overhang length of the insulating film 3 at the site where the hole current is distributed so as to be small is configured to be small. The end portion of the insulating film 3 is configured to be a curve shape according the above-described determination condition, so that it is possible to alleviate the current concentration at the end portion of the insulating film 3.

According to the ninth embodiment, the width of the peripheral portion 2 can be reduced by at least 10% without a decrease in the reverse recovery resistant amount in comparison with the case of the related art. As a result, since the chip size can be reduced, the yield of chips per wafer is also increased, and the unit price of chip can be reduced.

According to the first to ninth embodiments described above, it is possible to provide a semiconductor device having a high reverse recovery resistant amount or a high turn-off resistant amount by easily increasing the sheet resistance of the p type diffusion region peripheral portion which is in contact with the metal electrode on the surface.

What is claimed is:

1. A semiconductor device, comprising:
    a first-conductivity-type semiconductor substrate;
    a second-conductivity-type diffusion region having a rectangular plane pattern that is disposed in a surface layer of one main surface of the first-conductivity-type semiconductor substrate; and
    a ring-shaped voltage-resistant region that surrounds the second-conductivity-type diffusion region,
    wherein the second-conductivity-type diffusion region includes:
        an active region in which a metal electrode is in ohmic contact with a surface of a central portion thereof, and
        a ring-shaped peripheral portion that surrounds the active region, that has an inner circumferential end and an outer circumferential end, and that includes an insulating film on a surface thereof; and
    wherein the ring-shaped peripheral portion includes a second-conductivity-type diffusion region extension portion that is selectively diffused, that increases sheet resistance between the inner circumferential end and the outer circumferential end of the ring-shaped peripheral portion, and that includes:
        a plurality of second-conductivity-type stretch-out portions that are stretched out from the inner circumferential end toward the outer circumferential end in a stripe shape having a predetermined width, that extend in an outer peripheral direction and maintain the predetermined width, that connect to the diffusion region, and that have a depth and an impurity concentration that are the same as that of the diffusion region; and
        a ladder-shaped extension portion where a plurality of first-conductivity-type stripe-shaped substrate surfaces that are configured with exposed surfaces of the semiconductor substrate are alternately disposed in parallel to each other.

2. The semiconductor device according to claim 1, wherein the second-conductivity-type stretch-out portion has short side having a width and the first-conductivity-type stripe-shaped substrate surface has a short side having a width, and wherein a ratio of the width of the short side of the second-conductivity-type stretch-out portion to the width of the short side of the first-conductivity-type stripe-shaped substrate surface is 0.1 or more and 0.5 or less.

3. The semiconductor device according to claim 1, wherein, when the second-conductivity-type diffusion region has a diffusion depth defined by Xj and the first-conductivity-type stripe-shaped substrate surface has a short side having a width defined by L, L is larger than 1.6 multiplied by Xj.

4. The semiconductor device according to claim 1, further comprising an insulating film that covers a surface of the ring-shaped peripheral portion.

5. The semiconductor device according to claim 1, further comprising a separated electrode that is in ohmic contact with a surface of the ring-shaped peripheral portion and is electrically separated from the metal electrode.

6. The semiconductor device according to claim 1, wherein the ladder-shaped extension portion has an outer circumference side, and wherein a plurality of second-conductivity-type ring-shaped diffusion regions are provided, that are electrically connected to the second-conductivity-type stretch-out portions and that have a diffusion depth larger than that of the second-conductivity-type diffusion region, and are separated from each other at the outer circumference side of the ladder-shaped extension portion.

7. The semiconductor device according to claim 6, wherein the plurality of second-conductivity-type ring-shaped diffusion regions have an innermost circumferential end, the second-conductivity-type diffusion region has an outer circumferential end, and the second-conductivity-type stretch-out portion has an outer-circumferential-direction length, and wherein an interval in a predetermined direction between the innermost circumferential end of the plurality of second-conductivity-type ring-shaped diffusion regions and the outer circumferential end of the second-conductivity-type diffusion region is equal to or larger than the outer-circumferential-direction length of the second-conductivity-type stretch-out portion.

8. The semiconductor device according to claim 6, wherein the plurality of second-conductivity-type ring-shaped diffusion regions have innermost circumferential ends, and wherein the second-conductivity-type stretch-out portions and the innermost circumferential ends of the plurality of second-conductivity-type ring-shaped diffusion regions are in contact with each other.

9. The semiconductor device according to claim 6, wherein the second-conductivity-type ring-shaped diffusion region has a surface that is separated at an outer side of the ladder-shaped extension portion, and the semiconductor device further comprises a separated electrode that is electrically connected to a surface of the second-conductivity-type stretch-out portion and is provided at the surface of the second-conductivity-type ring-shaped diffusion region that is separated at an outer side of the ladder-shaped extension portion.

10. The semiconductor device according to claim 1, wherein the active region has a side having an inner circumferential end having a shape, and the shape of the inner circumferential end in the side of the active region of the insulating film on the surface of the ring-shaped peripheral portion is a non-straight-line shape where an overhang length to the side of the active region is set to be large in a large-current portion and the overhang length is set to be small in a small-current portion according to an inner-circumferential-end plane distribution of the reverse recovery current having the peripheral portion as a path.

11. The semiconductor device according to claim 10, wherein the second-conductivity-type diffusion region extension portion of the ring-shaped peripheral portion includes:
    a plurality of first second-conductivity-type lattice line portions, each of which has an angle θ of 0° or more and 90° or less with respect to a direction from a center of the semiconductor device having a rectangular shape toward an outer circumferential end of the semiconductor device; and a plurality of second second-conductivity-type lattice line portions, each of which has an angle of −θ with respect to the direction from the center toward the outer circumferential end of the semiconductor device, and the first second-conductivity-type lattice line portions and the second second-conductivity-type lattice line portions intersect each other at an angle of 2θ.

12. The semiconductor device according to claim 1, wherein:
the second-conductivity-type diffusion region is an anode diffusion region; and
a first-conductivity-type cathode diffusion region having a concentration that is higher than that of the first-conductivity-type semiconductor substrate is installed on a surface layer of the other main surface of the first-conductivity-type semiconductor substrate, so that the semiconductor device has a function as a vertical diode.

13. The semiconductor device according to claim 1, wherein:
the second-conductivity-type diffusion region is a second-conductivity-type base region that is selectively formed on a surface layer of the one main surface of the first-conductivity-type semiconductor substrate;
a first-conductivity-type source region is selectively formed on a surface of the base layer;
a gate electrode is formed to face surfaces of the first-conductivity-type semiconductor substrate, the base region, and the source region through a gate insulating film; and
a first-conductivity-type drain layer having a concentration that is higher than that of the first-conductivity-type semiconductor substrate is installed on a surface layer of the other main surface of the first-conductivity-type semiconductor substrate, so that the semiconductor device has a function as a MOSFET.

14. The semiconductor device according to claim 1, wherein:
the second-conductivity-type diffusion region is a second-conductivity-type base region that is selectively formed on a surface layer of the one main surface of the first-conductivity-type semiconductor substrate;
a first-conductivity-type emitter region is selectively formed on a surface of the base region;
a gate electrode is formed to face surfaces of the first-conductivity-type semiconductor substrate, the base region, and the emitter region through a gate insulating film; and
a second-conductivity-type collector layer having a concentration that is higher than that of the first-conductivity-type semiconductor substrate is installed on a surface layer of the other main surface of the first-conductivity-type semiconductor substrate, so that the semiconductor device has a function as an IGBT.

* * * * *